(12) United States Patent
Suraj Prakash et al.

(10) Patent No.: US 12,027,476 B2
(45) Date of Patent: Jul. 2, 2024

(54) PACKAGE COMPRISING SUBSTRATE WITH COUPLING ELEMENT FOR INTEGRATED DEVICES

(71) Applicant: QUALCOMM Incorporated, San Diego, CA (US)

(72) Inventors: Fnu Suraj Prakash, San Diego, CA (US); Paragkumar Ajaybhai Thadesar, San Diego, CA (US); John Jong-Hoon Lee, San Diego, CA (US); Nikhil Raman, Cambridge, MA (US); Peng Song, San Diego, CA (US); Francesco Carrara, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 58 days.

(21) Appl. No.: 17/575,492

(22) Filed: Jan. 13, 2022

(65) Prior Publication Data

US 2023/0223362 A1    Jul. 13, 2023

(51) Int. Cl.
| | |
|---|---|
| *H01L 23/64* | (2006.01) |
| *H01F 27/28* | (2006.01) |
| *H01L 23/528* | (2006.01) |
| *H01L 49/02* | (2006.01) |
| *H05K 1/16* | (2006.01) |

(52) U.S. Cl.
CPC ....... *H01L 23/645* (2013.01); *H01F 27/2804* (2013.01); *H01L 23/528* (2013.01); *H01L 28/10* (2013.01); *H05K 1/165* (2013.01)

(58) Field of Classification Search
CPC ..... H01L 23/645; H01L 28/10; H01L 23/528; H01F 41/042; H01F 19/04; H01F 27/2804; H05K 1/165
USPC .......................................... 257/531; 438/957
See application file for complete search history.

(56) References Cited

U.S. PATENT DOCUMENTS

| | | | |
|---|---|---|---|
| 5,095,357 A | 3/1992 | Andoh et al. | |
| 2017/0207203 A1* | 6/2017 | Song et al. | ............. H01L 28/10 |
| 2017/0207293 A1 | 7/2017 | Song et al. | |

FOREIGN PATENT DOCUMENTS

JP        2007123785 A      5/2007

OTHER PUBLICATIONS

International Search Report and Written Opinion—PCT/US2022/053812—ISA/EPO—dated Apr. 25, 2023.

* cited by examiner

*Primary Examiner* — Thinh T Nguyen
(74) *Attorney, Agent, or Firm* — Loza & Loza, LLP

(57) ABSTRACT

A package comprising a substrate, a first integrated device coupled to a first surface of the substrate, and a second integrated device coupled to a second surface of the substrate. The substrate includes a dielectric layer and a plurality of interconnects. The plurality of interconnects includes a first plurality of interconnects configured as a first inductor and a second plurality of interconnects configured as a second inductor. The first integrated device is configured to be coupled to the first inductor. The second integrated device is configured to be coupled to the second inductor. The second integrated device is configured to tune the first inductor through the second inductor.

10 Claims, 15 Drawing Sheets

CROSS SECTIONAL PROFILE VIEW

CROSS SECTIONAL PROFILE VIEW

*CROSS SECTIONAL PROFILE VIEW*

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

PACKAGE COMPRISING SUBSTRATE WITH COUPLING ELEMENT FOR INTEGRATED DEVICES

FIELD

Various features relate to packages with substrates and integrated devices.

BACKGROUND

A package may include a substrate and integrated devices. These components are coupled together to provide a package that may perform various electrical functions. There is an ongoing need to provide better performing packages and reduce the overall size of packages.

SUMMARY

Various features relate to packages with substrates and integrated devices.

One example provides a package comprising a substrate, a first integrated device coupled to a first surface of the substrate, and a second integrated device coupled to a second surface of the substrate. The substrate includes a dielectric layer and a plurality of interconnects. The plurality of interconnects includes a first plurality of interconnects configured as a first inductor and a second plurality of interconnects configured as a second inductor. The first integrated device is configured to be coupled to the first inductor. The second integrated device is configured to be coupled to the second inductor. The second integrated device is configured to tune the first inductor through the second inductor.

Another example provides a package comprising a substrate, a first integrated device coupled to a first surface of the substrate, and a second integrated device coupled to a second surface of the substrate. The substrate includes a means for first inductance and a means for second inductance. The first integrated device is configured to be coupled to the means for first inductance. The second integrated device is configured to be coupled to the means for second inductance. The second integrated device is configured to tune the means for first inductance through the means for second inductance.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate, a first integrated device coupled to a first surface of the substrate, and a second integrated device coupled to a second surface of the substrate. The substrate includes at least one dielectric layer and a plurality of interconnects. The plurality of interconnects includes a first plurality of interconnects configured as a first inductor and a second plurality of interconnects configured as a second inductor. The first integrated device is configured to be coupled (e.g., electrically coupled) to the first inductor. The second integrated device is configured to be coupled (e.g., electrically coupled) to the second inductor. The second integrated device is configured to tune the first inductor through the second inductor. The first inductor and the second inductor may be part of a coupling element located in the substrate. The coupling element may be an inductive coupling element. The substrate may include several coupling elements that each include two or more inductors. The second integrated device may be configured to tune in real-time several inductors for several different integrated devices. As will be further described below, the coupling element(s) helps provide real-time tuning of one or more inductors for integrated devices that are configured for radio frequency (RF) functionality (e.g., processing RF signals, receiving and/or transmitting RF signals), which helps provide improved package performance, while keeping the package small and thin.

Figure 1:
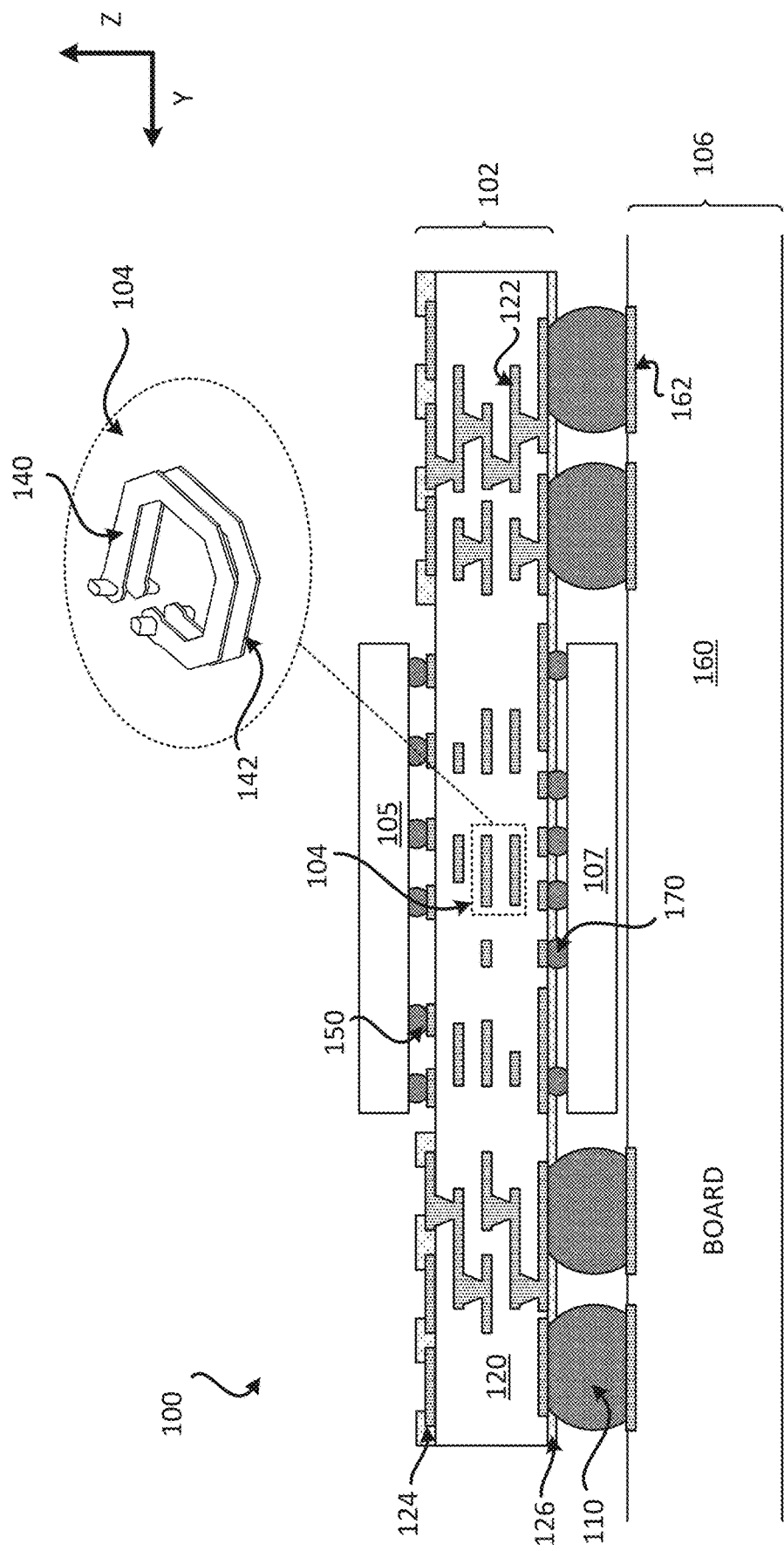
FIG. 1 illustrates an exemplary cross sectional profile view of a package that includes a substrate comprising a coupling element.

Exemplary Package Comprising a Substrate with Coupling Element Comprising a First Inductor and a Second Inductor FIG. 1 illustrates a cross sectional profile view of a package 100 that includes a substrate with a coupling element that includes a first inductor and a second inductor. The package 100 is coupled to a board 106 through a plurality of solder interconnects 110. The board 106 includes at least one board dielectric layer 160 and a plurality of board interconnects 162. The board 106 may include a printed circuit board (PCB).

The package 100 includes a substrate 102, an integrated device 105 (e.g., first integrated device) and an integrated device 107 (e.g., second integrated device). The integrated device 105 is coupled to a first surface (e.g., top surface) of the substrate 102 through a plurality of solder interconnects 150. The integrated device 107 is coupled to a second surface (e.g., bottom surface) of the substrate 102 through a plurality of solder interconnects 170. The integrated device 107 may include a controller die. The integrated device 107 may include a controller for controlling inductance of an inductor coupled to the integrated device 105. The integrated device 105 may be configured for radio frequency (RF) functionality (e.g., processing RF signals, receiving and/or transmitting RF signals).

The substrate 102 includes at least one dielectric layer 120 and a plurality of interconnects 122. The substrate 102 may include a solder resist layer 124 and a solder resist layer 126. The substrate 102 may include at least one coupling element 104. The coupling element 104 may be an inductive coupling element (e.g., means for inductive coupling). The coupling element 104 may include a first inductor 140 and a second inductor 142. The first inductor 140 may be a means for first inductance. The second inductor 142 may be a means for second inductance. The coupling element 104, the first inductor 140, and/or the second inductor 142 may be defined by interconnects from the plurality of interconnects 122. For example, the first inductor 140 may be defined by a first plurality of interconnects from the plurality of interconnects 122, and the second inductor 142 may be defined by a second plurality of interconnects from the plurality of interconnects 122. The first inductor 140 includes at least one winding, and the second inductor 142 includes at least one winding. The at least one winding of the first inductor 140 overlaps vertically with the at least one winding of the second inductor 142. The vertical overlap may be a partial overlap or a complete overlap of the windings. The at least one winding of the first inductor 140 may be located on different metal layer(s) than the at least one winding of the second inductor 142. For example, one or more interconnects for a winding of the first inductor 140 may be located on a first metal layer of the substrate 102, and one or more interconnects for a winding of the second inductor 142 may be located on a second metal layer of the substrate 102. It is noted that the first inductor 140 may have one or more windings (e.g., one or more first windings). Each winding of the first inductor 140 may be located on a different metal layer of the substrate 102. Similarly, the second inductor 142 may have one or more windings (e.g., one or more second windings). Each winding of the second inductor 142 may be located on a different metal layer of the substrate 102. In some implementations, the windings of the first inductor 140 may be intertwined (e.g., vertically intertwined and/or horizontally intertwined) with the windings of the second inductor 142. Examples of inductors with more than one winding and/or that are intertwined (e.g., vertically intertwined and/or horizontally intertwined) are further illustrated and described in FIGS. 6-8.

The integrated device 105 and the integrated device 107 are each configured to be coupled to the coupling element 104. The integrated device 105, the integrated device 107 and the coupling element 104 overlap vertically (e.g., partial or complete vertical overlap) with each other. The integrated device 105 is configured to be coupled to the first inductor 140. The integrated device 107 is configured to be coupled to the second inductor 142. The integrated device 107 may be configured to control and/or tune in real-time the inductance of the first inductor 140 through the second inductor 142. The second inductor 142 may be configured to induce an inductance in the first inductor 140. For example, the second inductor 142 may be turned on to induce an inductance in the first inductor 140 for the integrated device 105. In some implementations, the second inductor 142 may be turned on to tune in real-time the inductance of the first inductor 140 for the integrated device 105. The ability of the integrated device 107 to tune the first inductor 140 for the integrated device 105, helps improve the performance of the integrated device 105 by better matching the inductance of the first inductor 140 with the various signals that are being processed, received and/or transmitted by the integrated device 105, while still providing a thin and compact package 100. For example, one area of improvement for the package is the improvement of memory effect in the package.

In one example, the first inductor 140 may have a first inductance value (e.g., when the second inductor 142 is off). However, when the second inductor 142 is turned on, the first inductor 140 may have another inductance value. The second inductor 142 may be configured to induce the first inductor 140 to have different inductance values (e.g., second inductance value, third inductance value, fourth inductance value). For example, (i) at a first time period/first moment in time, the first inductor 140 may be inducted to have a first inductance value, (ii) at a second time period/second moment in time, the first inductor 140 may be inducted to have a second inductance value, (ii) at a third time period/third moment in time, the first inductor 140 may be inducted to have a third inductance value. The inductance value of the first inductor 140 may be controlled by the integrated device 107 through control of the second inductor 142. In some implementations, the integrated device 107 may control the second inductor 142 by controlling and/or specifying the inductance value of the second inductor 142. The above description of how to control the first inductor 140 and the second inductor 142 may be applicable to any of the inductors described in the disclosure.

In some implementations, a package may include different configurations of the integrated device 105, the integrated device 107 and/or the coupling element 104.

Figure 2:
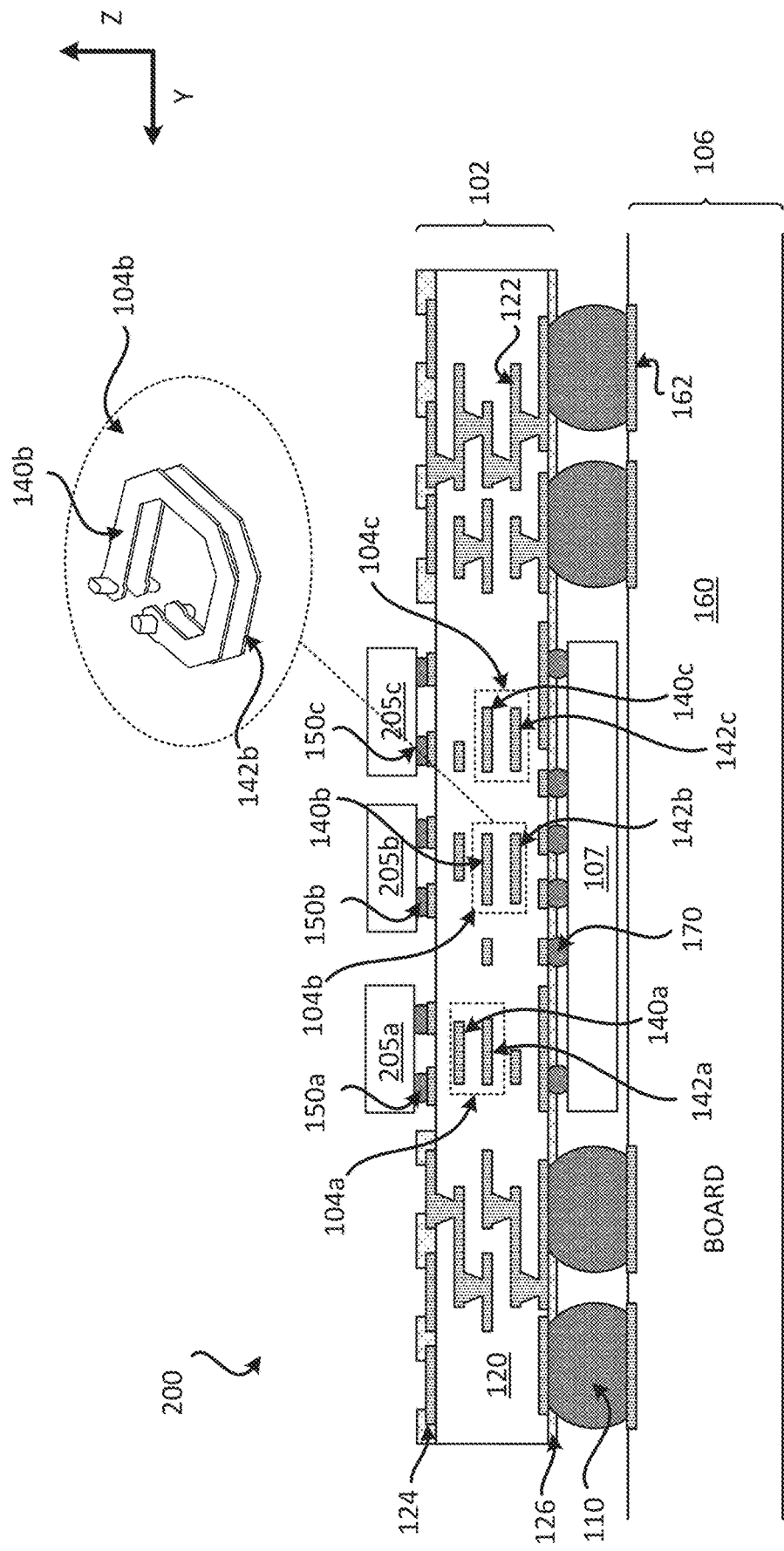
FIG. 2 illustrates an exemplary cross sectional profile view of a package that includes a substrate comprising several coupling elements.

FIG. 2 illustrates a package 200 that includes a substrate with several coupling elements. The package 200 is similar to the package 100 and includes similar components as the package 100. The package 200 includes the substrate 102, the integrated device 107, an integrated device 205a, an integrated device 205b, and an integrated device 205c.

The integrated device 205a is coupled to a first surface (e.g., top surface) of the substrate 102 through a plurality of solder interconnects 150a. The integrated device 205b is coupled to a first surface (e.g., top surface) of the substrate 102 through a plurality of solder interconnects 150b. The integrated device 205c is coupled to a first surface (e.g., top surface) of the substrate 102 through a plurality of solder interconnects 150c. The integrated device 107 is coupled to a second surface (e.g., bottom surface) of the substrate 102 through a plurality of solder interconnects 170.

The substrate 102 includes a coupling element 104a, a coupling element 104b and a coupling element 104c. Each coupling element (e.g., 104a, 104b, 104c) may include a respective first inductor (e.g., 140a, 140b, 140c) and a respective second inductor (e.g., 142a, 142b, 142c), as described for the coupling element 104.

The integrated device 107 and the integrated device 205a are each configured to be coupled to the coupling element 104a. The integrated device 205a is configured to be coupled to a first inductor 140a of the coupling element 104a. The integrated device 107 is configured to be coupled to a second inductor 142a of the coupling element 104a. The integrated device 107 and the integrated device 205b are each configured to be coupled to the coupling element 104b. The integrated device 205b is configured to be coupled to a first inductor 140b of the coupling element 104b. The integrated device 107 is configured to be coupled to a second inductor 142b of the coupling element 104b. The integrated device 107 and the integrated device 205c are each configured to be coupled to the coupling element 104c. The integrated device 205c is configured to be coupled to a first inductor 140c of the coupling element 104c. The integrated device 107 is configured to be coupled to a second inductor 142c of the coupling element 104c. It is noted that the coupling elements and the inductors may be located on the same and/or different metal layers of the substrate 102. The coupling elements and/or inductors may have various sizes, shapes and/or various numbers of windings. Each of the coupling elements (e.g., 104a, 104b, 104c) may be defined by interconnects from the plurality of interconnects 122. The physical features and functional features that are described for the coupling element 104 may be applicable to the coupling element 104a, the coupling element 104b and/or the coupling element 104c.

The integrated device 107 may be configured to control and/or tune in real-time the inductance of the first inductor 140a of the coupling element 104a through the second inductor 142a of the coupling element 104a. The integrated device 107 may be configured to control and/or tune in real-time the inductance of the first inductor 140b of the coupling element 104b through the second inductor 142b of the coupling element 104b. The integrated device 107 may be configured to control and/or tune in real-time the inductance of the first inductor 140c of the coupling element 104c through the second inductor 142c of the coupling element 104c. Thus, one integrated device (e.g., 107) may be configured to control and/or tune in real-time the inductors and/or inductances coupled to several integrated devices (e.g., 205a. 205b, 205c). The integrated device (e.g., 107) may be configured to control and/or tune in real-time the inductors and/or inductances coupled to several integrated devices (e.g., 205a, 205b, 205c) at the same time and/or sequentially. Thus, for example, the integrated device 107 may simultaneously control the inductance of inductors for each of the integrated devices (e.g., 205a, 205b, 205c) while each of these integrated devices (e.g., 205a, 205b, 205c) are in operation (e.g., while various signals are being processed, received and/or transmitted by each of these integrated devices (e.g., 205a, 205b, 205c)). The integrated device 205a, the integrated device 205b and/or the integrated device 205c may be similar to the integrated device 105. Each of the integrated devices (e.g., 205a, 205b, 205c) may be configured to process, receive and/or transmit various signals. As will be further described below, each integrated device (e.g., 205a, 205b, 205c) may be configured to process, receive and/or transmit different signals (e.g., signals at different frequencies). The integrated device 205a, the integrated device 205b and/or the integrated device 205c may overlap vertically (e.g., partial vertical overlap, complete vertical overlap) with the integrated device 107.

The integrated device 107 may include a controller die. The integrated device 107 may include a controller for controlling inductance of a respective inductor coupled to the integrated device 205a, the integrated device 205b, and/or the integrated device 205c. The integrated devices 205a, 205b, and/or 205c may each be configured for radio frequency (RF) functionality (e.g., processing RF signals, receiving and/or transmitting RF signals). In some implementations, the integrated device 205a is configured for processing, receiving and/or transmitting RF signals in a first range of frequencies. In some implementations, the integrated device 205b is configured for processing, receiving and/or transmitting RF signals in a second range of frequencies. In some implementations, the integrated device 205c is configured for processing, receiving and/or transmitting RF signals in a third range of frequencies. Although FIG. 2 illustrates a package that includes three integrated devices for processing signals, it is understood that a package can include more than three integrated devices for processing signals, and that the integrated device 107 may be configured to control the inductance of inductors coupled to more than three integrated devices.

Figure 3:
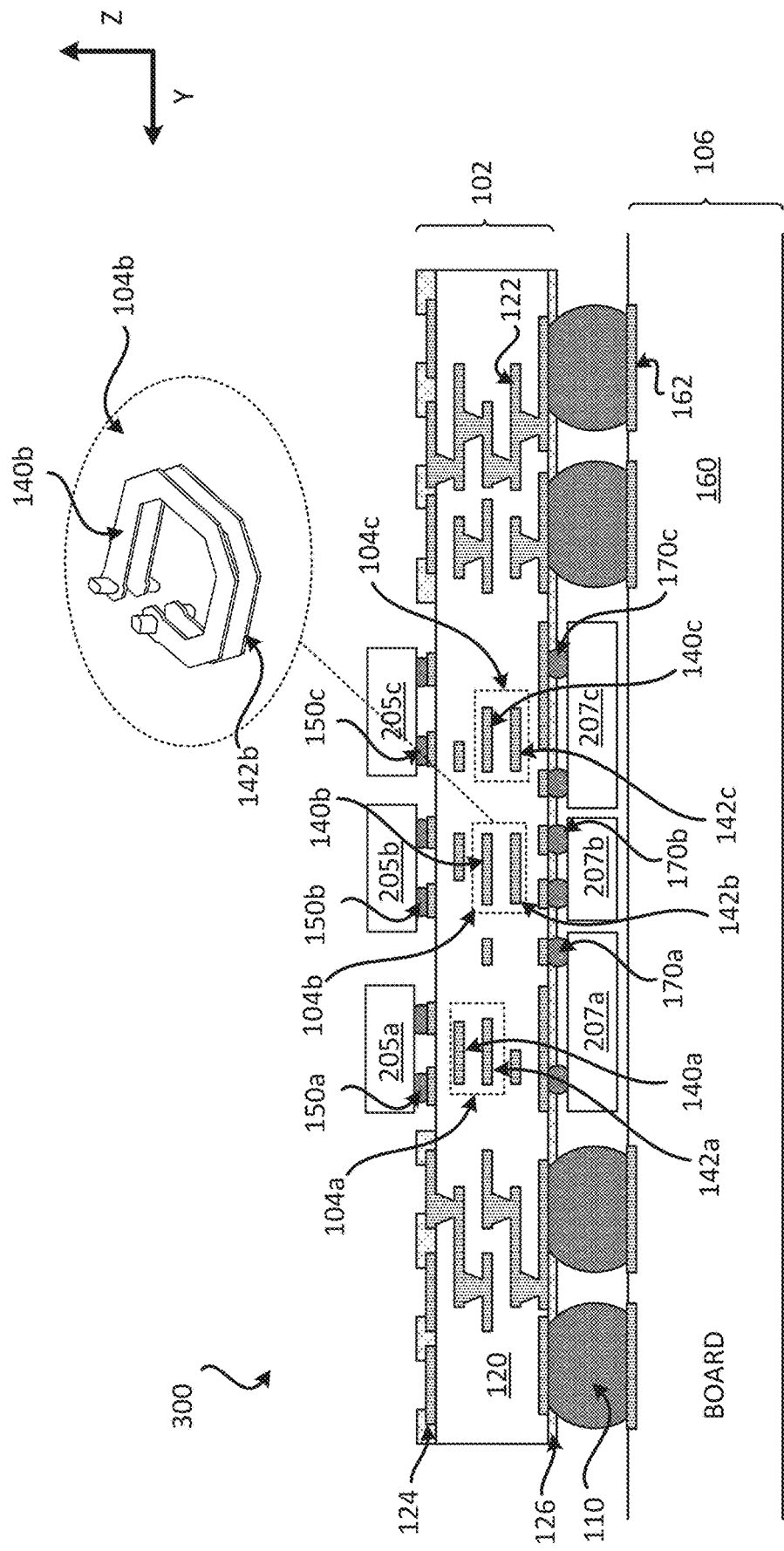
FIG. 3 illustrates an exemplary cross sectional profile view of a package that includes a substrate comprising several coupling elements.

FIG. 3 illustrates a package 300 that includes a substrate with several coupling elements. The package 300 is similar to the package 200 and includes similar components as the package 200. The package 300 includes the substrate 102, an integrated device 205a, an integrated device 205b, an integrated device 205c, an integrated device 207a, an integrated device 207b, and an integrated device 207c.

The integrated device 205a is coupled to a first surface (e.g., top surface) of the substrate 102 through a plurality of solder interconnects 150a. The integrated device 205b is coupled to a first surface (e.g., top surface) of the substrate 102 through a plurality of solder interconnects 150b. The integrated device 205c is coupled to a first surface (e.g., top surface) of the substrate 102 through a plurality of solder interconnects 150c. The integrated device 207a is coupled to a second surface (e.g., bottom surface) of the substrate 102 through a plurality of solder interconnects 170a. The integrated device 207b is coupled to a second surface (e.g., bottom surface) of the substrate 102 through a plurality of solder interconnects 170b. The integrated device 207c is coupled to a second surface (e.g., bottom surface) of the substrate 102 through a plurality of solder interconnects 170c.

The substrate 102 includes a coupling element 104a, a coupling element 104b and a coupling element 104c. Each coupling element may include a first inductor (e.g., 140a. 140b. 140c) and a second inductor (e.g., 142a, 142b, 142c), as described for the coupling element 104. Each of the coupling elements (e.g., 104a, 104b, 104c) may be defined by interconnects from the plurality of interconnects 122. The physical features and functional features that are described for the coupling element 104 may be applicable to the coupling element 104a, the coupling element 104b and/or the coupling element 104c.

The integrated device 205a and the integrated device 207a are each configured to be coupled to the coupling element 104a. The integrated device 205a is configured to be coupled to a first inductor 140a of the coupling element 104a. The integrated device 207a is configured to be coupled to a second inductor 142a of the coupling element 104a. The integrated device 205b and the integrated device 207b are each configured to be coupled to the coupling element 104b. The integrated device 205b is configured to be coupled to a first inductor 140b of the coupling element 104b. The integrated device 207b is configured to be coupled to a second inductor 142*b* of the coupling element 104*b*. The integrated device 205*c* and the integrated device 207*c* are each configured to be coupled to the coupling element 104*c*. The integrated device 205*c* is configured to be coupled to a first inductor 140*c* of the coupling element 104*c*. The integrated device 207*c* is configured to be coupled to a second inductor 142*c* of the coupling element 104*c*. It is noted that the coupling elements and the inductors may be located on the same and/or different metal layers of the substrate 102. The coupling elements and/or inductors may have various sizes, shapes and/or various numbers of windings.

The integrated device 207*a* may be configured to control and/or tune in real-time the inductance of the first inductor 140*a* of the coupling element 104*a* through the second inductor 142*a* of the coupling element 104*a*. The integrated device 207*b* may be configured to control and/or tune in real-time the inductance of the first inductor 140*b* of the coupling element 104*b* through the second inductor 142*b* of the coupling element 104*b*. The integrated device 207*c* may be configured to control and/or tune in real-time the inductance of the first inductor 140*c* of the coupling element 104*c* through the second inductor 142*c* of the coupling element 104*c*.

The integrated devices (e.g., 207*a*, 207*b*, 207*c*) may each include a controller die. The integrated device 207*a* may include a controller for controlling inductance of an inductor coupled to the integrated device 205*a*. The integrated device 207*b* may include a controller for controlling inductance of an inductor coupled to the integrated device 205*b*. The integrated device 207*c* may include a controller for controlling inductance of an inductor coupled to the integrated device 205*c*. The integrated devices 205*a*, 205*b*, and/or 205*c* may each be configured for radio frequency (RF) functionality (e.g., processing RF signals, receiving and/or transmitting RF signals). In some implementations, the integrated device 205*a* is configured for processing, receiving and/or transmitting RF signals in a first range of frequencies. In some implementations, the integrated device 205*b* is configured for processing, receiving and/or transmitting RF signals in a second range of frequencies. In some implementations, the integrated device 205*c* is configured for processing, receiving and/or transmitting RF signals in a third range of frequencies.

Figure 4:
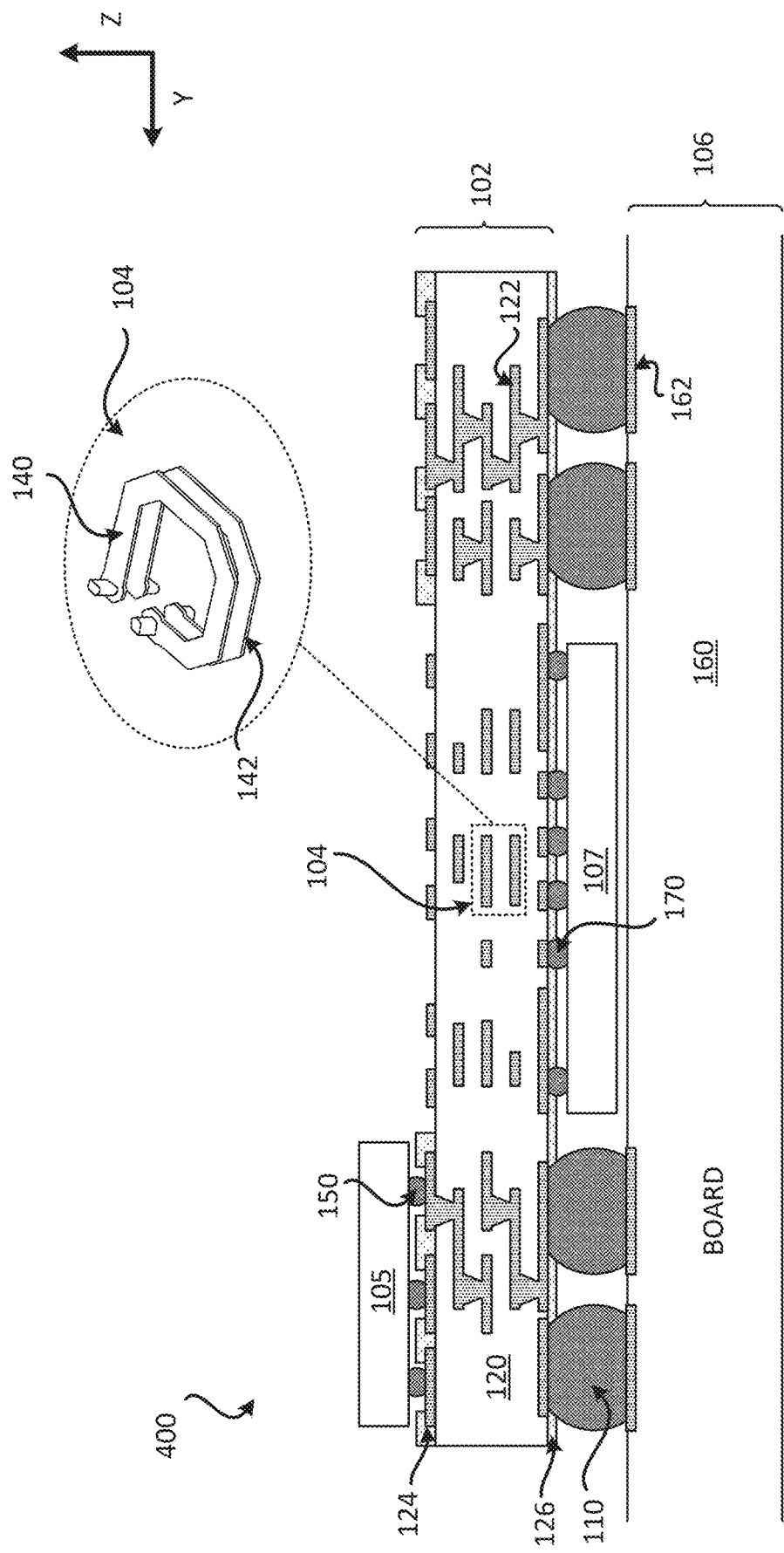
FIG. 4 illustrates an exemplary cross sectional profile view of a package that includes a substrate comprising a coupling element.

FIG. 4 illustrates a package 400 that includes a substrate with a coupling element. The package 400 is similar to the package 100 and includes similar components as the package 100. The package 400 includes the substrate 102, the integrated device 105 and the integrated device 107. As shown in FIG. 4, the integrated device 105 is coupled to the substrate 102 such that the integrated device 105 does not overlap vertically with (i) the integrated device 107 and (ii) the coupling element 104 (that includes the first inductor 140 and the second inductor 142). The integrated device 105 is offset from the integrated device 107, and vice versa. In some implementations, offsetting the integrated device 105 from the coupling element 104 and/or the integrated device 107 may improve the performance of the integrated device 105. For example, any magnetic field that may be generated by the coupling element 104 may have a reduced effect on the performance of the integrated device 105 because of the offset (e.g., horizontal offset) between the coupling element 104 and the integrated device 105.

Figure 5:
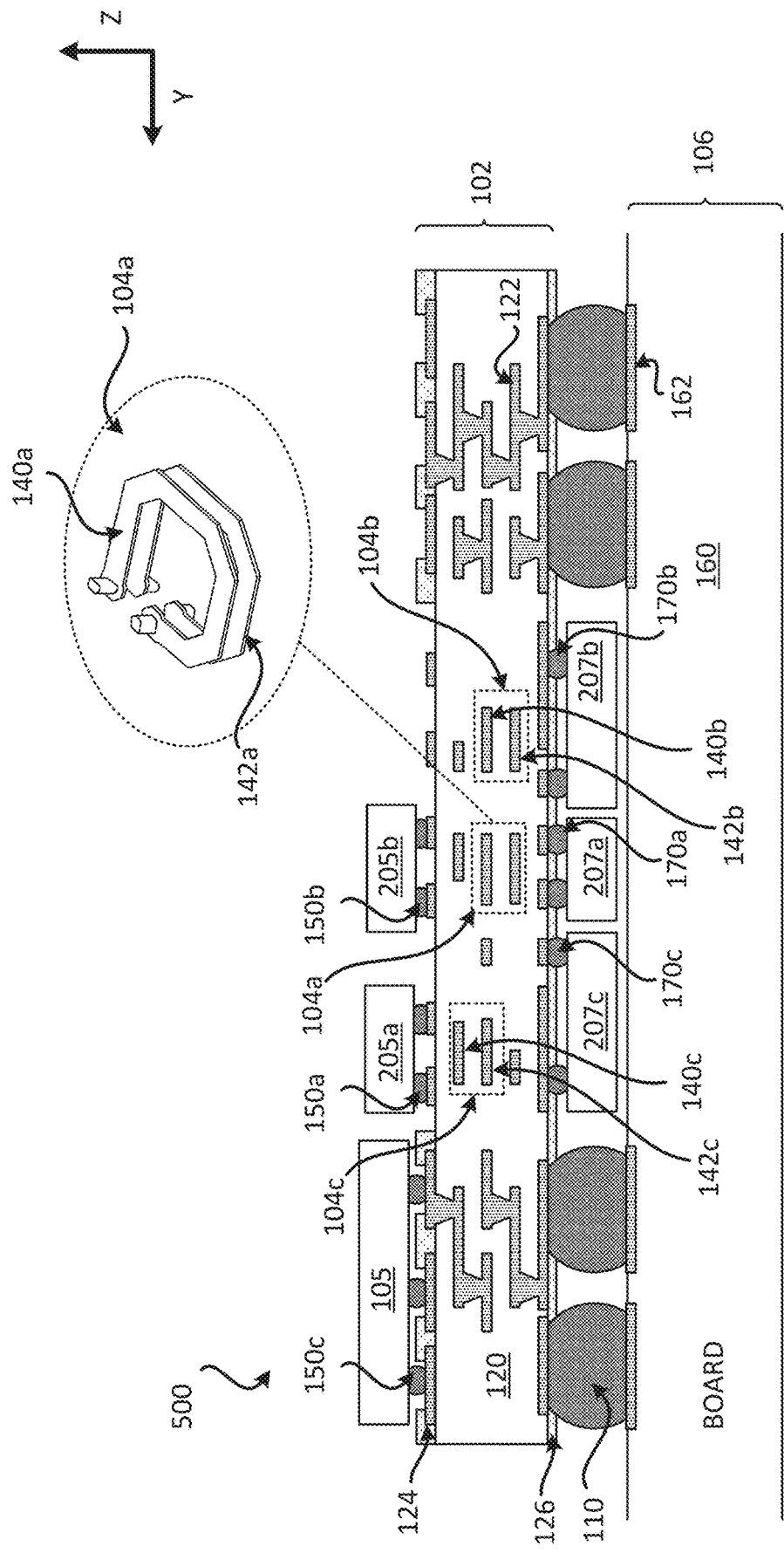
FIG. 5 illustrates an exemplary cross sectional profile view of a package that includes a substrate comprising several coupling elements.

FIG. 5 illustrates a package 500 that includes a substrate with several coupling elements. The package 500 is similar to the package 200 and the package 400, and includes similar components as the package 200 and the package 400. The package 500 includes the substrate 102, the integrated device 205*a*, the integrated device 205*b*, the integrated device 105, the integrated device 207*a*, the integrated device 207*b* and the integrated device 207*c*. As shown in FIG. 5, the integrated device 105 is coupled to the substrate 102 such that the integrated device 105 does not overlap vertically with the integrated device 207*c* and the coupling element 104*c* (that includes the first inductor 140*c* and the second inductor 142*c*). The integrated device 105 is offset from the integrated device 207*c*, and vice versa. In some implementations, offsetting the integrated device 105 from the coupling element 104*c* and/or the integrated device 207*c* may improve the performance of the integrated device 105. For example, any magnetic field that may be generated by the coupling element 104*c* may have a reduced effect on the performance of the integrated device 105 because of the offset (e.g., horizontal offset) between the coupling element 104*c* and the integrated device 105. It is noted that other combinations of coupling elements and integrated device may also be similarly offset.

The integrated device 105 and the integrated device 207*c* are each configured to be coupled to the coupling element 104*c*. The integrated device 105 is configured to be coupled to a first inductor 140 of the coupling element 104*c*. The integrated device 207*c* is configured to be coupled to a second inductor 142*c* of the coupling element 104*c*. The integrated device 205*a* and the integrated device 207*a* are each configured to be coupled to the coupling element 104*a*. The integrated device 205*a* is configured to be coupled to a first inductor 140*a* of the coupling element 104*a*. The integrated device 207*a* is configured to be coupled to a second inductor 142*a* of the coupling element 104*a*. The integrated device 205*b* and the integrated device 207*b* are each configured to be coupled to the coupling element 104*b*. The integrated device 205*b* is configured to be coupled to a first inductor 140*b* of the coupling element 104*b*. The integrated device 207*b* is configured to be coupled to a second inductor 142*b* of the coupling element 104*b*. It is noted that the coupling elements, and the inductors may be located on the same and/or different metal layers of the substrate 102. The coupling elements, and/or inductors may have varying sizes, shapes and/or varying numbers of windings.

The integrated devices (e.g., 207*a*, 207*b*, 207*c*) may each include a controller die. The integrated device 207*a* may include a controller for controlling inductance of an inductor coupled to the integrated device 205*a*. The integrated device 207*b* may include a controller for controlling inductance of an inductor coupled to the integrated device 205*b*. The integrated device 207*c* may include a controller for controlling inductance of an inductor coupled to the integrated device 105. The integrated devices 205*a*, 205*b*, and/or 105 may each be configured for radio frequency (RF) functionality (e.g., processing RF signals, receiving and/or transmitting RF signals). In some implementations, the integrated device 205*a* is configured for processing, receiving and/or transmitting RF signals in a first range of frequencies. In some implementations, the integrated device 205*b* is configured for processing, receiving and/or transmitting RF signals in a second range of frequencies. In some implementations, the integrated device 105 is configured for processing, receiving and/or transmitting RF signals in a third range of frequencies.

The disclosure describes a coupling element as comprising a first inductor and a second inductor. In some implementations, the first inductor may be considered as a third inductor and the second inductor may be considered as a fourth inductor. This may be the case when a substrate includes a first coupling element and a second coupling element. In some implementations, the first inductor may be considered as a fifth inductor and the second inductor may be considered as a sixth inductor. This may be the case when a substrate includes a first coupling element, a second coupling element, and a third coupling element.

Referring back to FIG. 3, in some implementations, the coupling element 104a may be a first coupling element, the coupling element 104b may be a second coupling element, and the coupling element 104c may be a third coupling element. In some implementations, the first inductor 140a of the coupling element 104a may be a first inductor that includes a first plurality of windings (e.g., defined by a first plurality of interconnects), the second inductor 142a of the coupling element 104a may be a second inductor that includes a second plurality of windings (e.g., defined by a second plurality of interconnects), the first inductor 140b of the coupling element 104b may be a third inductor that includes a third plurality of windings (e.g., defined by a third plurality of interconnects), the second inductor 142b of the coupling element 104b may be a fourth inductor that includes a fourth plurality of windings (e.g., defined by a fourth plurality of interconnects), the first inductor 140c of the coupling element 104c may be a fifth inductor that includes a fifth plurality of windings (e.g., defined by a fifth plurality of interconnects), and the second inductor 142c of the coupling element 104c may be a sixth inductor that includes a sixth plurality of windings (e.g., defined by a sixth plurality of interconnects).

Figure 6:
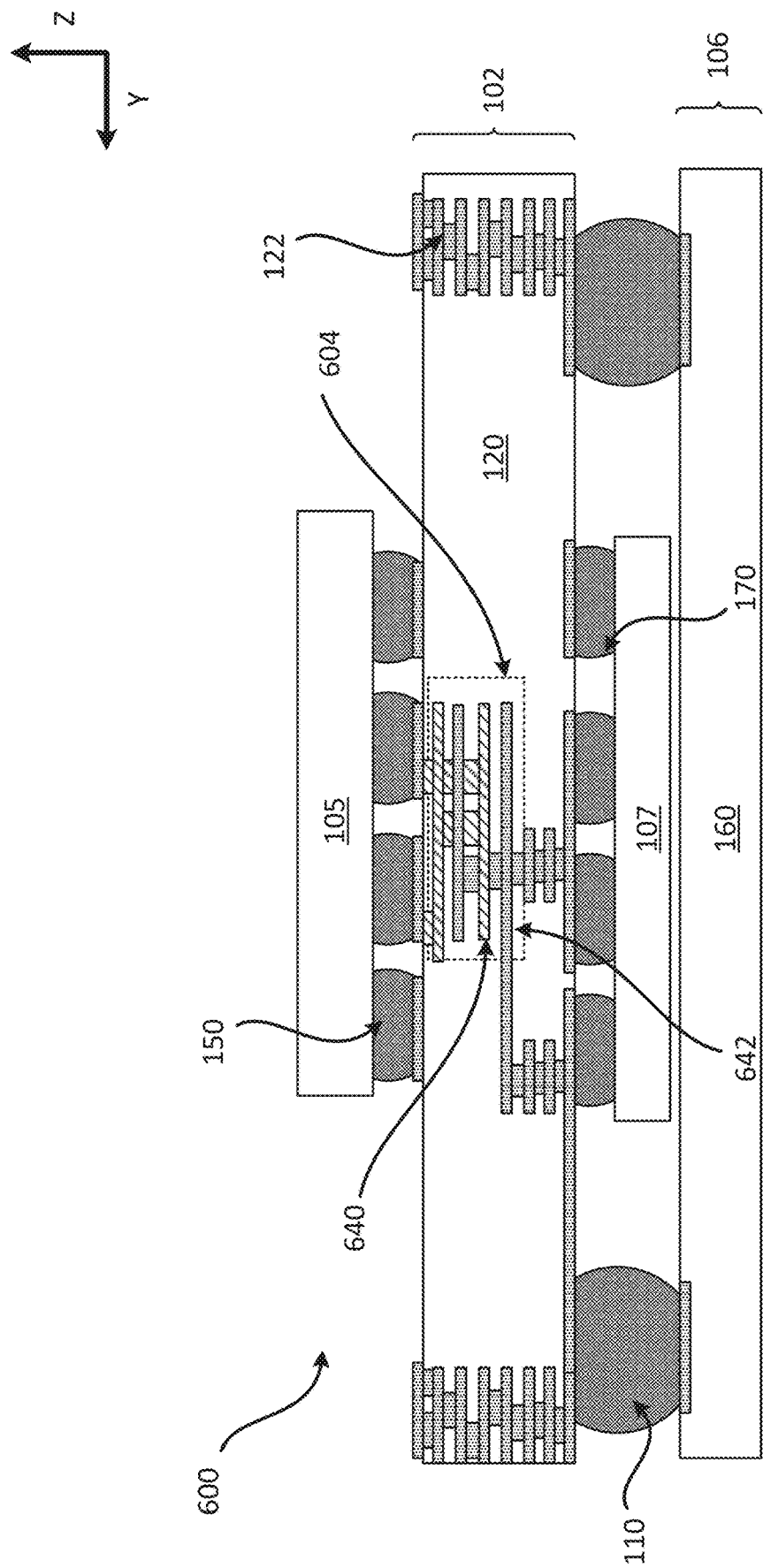
FIG. 6 illustrates an exemplary cross sectional profile view of a package that includes a substrate comprising a coupling element.
Figure 7:
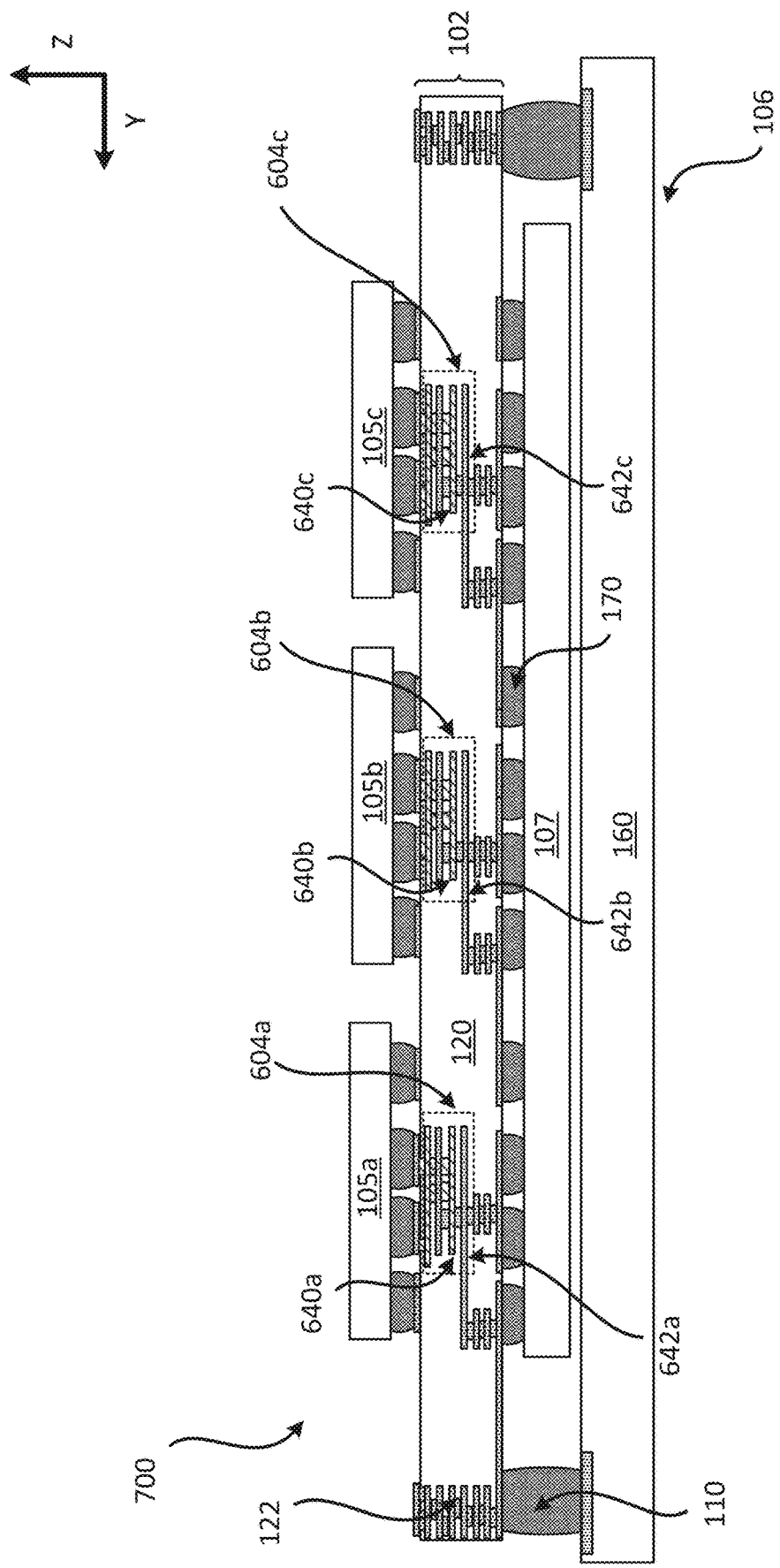
FIG. 7 illustrates an exemplary cross sectional profile view of a package that includes a substrate comprising several coupling elements.
Figure 8:
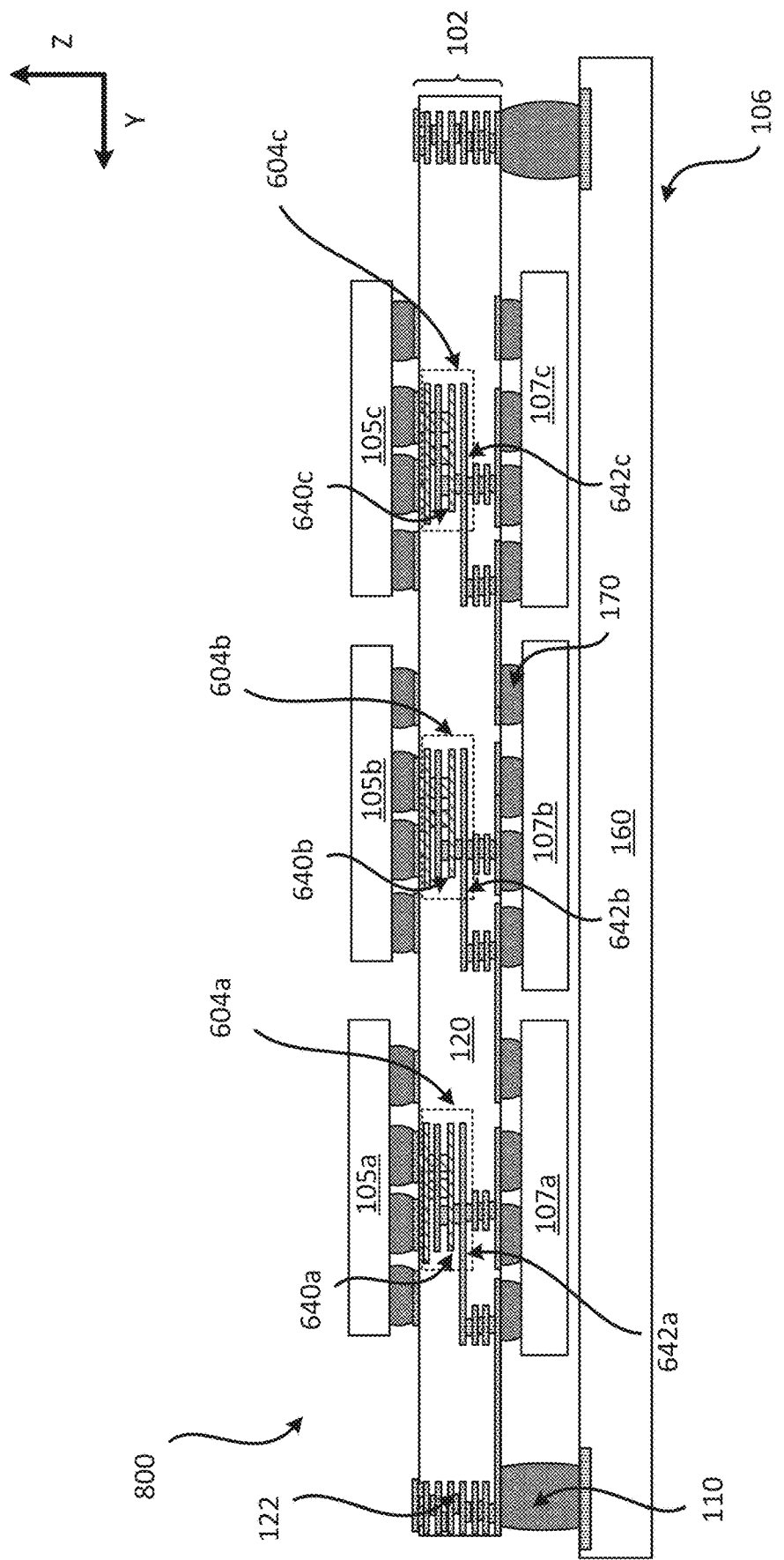
FIG. 8 illustrates an exemplary cross sectional profile view of a package that includes a substrate comprising several coupling elements.

As mentioned above, one or more inductors of one or more coupling elements may include several windings. For example, one or more coupling elements (e.g., 104, 104a, 104b, 104c) from the package 100, the package 200, the package 300, the package 400, and/or the package 500 may be replaced with coupling elements with inductors with several windings. FIGS. 6-8 illustrate packages that include substrates with inductors having several windings. In some implementations, the winding(s) of one inductor may be intertwined (e.g., vertically intertwined and/or horizontally intertwined) with the winding(s) of another inductor. The use of inductors with several windings and/or intertwined inductors may provide improved performance of the package, through improved inductive coupling between the inductors, which provide more accurate control of inductance values.

FIG. 6 illustrates an example of package 600 that includes a substrate with a coupling element with at least one inductor having several windings (e.g., several turns). FIG. 6 may illustrate a package 600 that has a similar configuration to the package 100. The package 600 includes the substrate 102, the integrated device 105, the coupling element 604 and the integrated device 107. The integrated device 105 is coupled to the substrate 102 through a plurality of solder interconnects 150. The integrated device 107 is coupled to the substrate 102 through a plurality of solder interconnects 170. The substrate 102 includes at least one dielectric layer 120 and a plurality of interconnects 122. The package 600 is coupled to a board 106.

The coupling element 604 includes a first inductor 640 and a second inductor 642. The first inductor 640 includes a first plurality of windings. The second inductor 642 includes a second plurality of windings. The first inductor 640 is intertwined (e.g., vertically intertwined and/or horizontally intertwined) with the second inductor 642. For example, the first plurality of windings of the first inductor 640 is intertwined (e.g., vertically intertwined and/or horizontally intertwined) with the second plurality of windings of the second inductor 642. The first plurality of windings of the first inductor 640 may be defined by a first plurality of interconnects from the plurality of interconnects 122. The second plurality of windings of the second inductor 642 may be defined by a second plurality of interconnects from the plurality of interconnects 122. In some implementations, a first plurality of interconnects from the plurality of interconnects 122 may be intertwined (e.g., vertically intertwined and/or horizontally intertwined) with a second plurality of interconnects from the plurality of interconnects 122.

In one example, the windings for the first inductor 640 may be located on the M1 and M3 metal layers, while the windings for the second inductor 642 may be located on the M2 and M4 metal layers. In another example, the windings for the first inductor 640 may be located on the M1, M3, and M5 metal layers, while the windings for the second inductor 642 may be located on the M2 and M4 metal layers. In another example, the windings for the first inductor 640 may be located on the M3, and M5 metal layers, while the windings for the second inductor 642 may be located on the M2 and M4 metal layers. The above are merely examples of possible metal layers on which the first inductor 640 and the second inductor 642 may be located in a substrate. A substrate that includes more or less metal layers may have inductors on the same or different metal layers.

The integrated device 105 is configured to be coupled to the first inductor 640 of the coupling element 604. The integrated device 107 is configured to be coupled to the second inductor 642 of the coupling element 604. The package 600 may operate in a similar manner as described for the package 100.

FIG. 7 illustrates an example of package 700 that includes a substrate with several coupling elements with at least one inductor having several windings. FIG. 7 may illustrate a package 700 that has a similar configuration to the package 200. The package 700 includes the substrate 102, the integrated device 107, a coupling element 604a, a coupling element 604b, a coupling element 604c, an integrated device 105a, an integrated device 105b and an integrated device 105c. The integrated device 105a is coupled to the substrate 102 through a plurality of solder interconnects 150a. The integrated device 105b is coupled to the substrate 102 through a plurality of solder interconnects 150b. The integrated device 105c is coupled to the substrate 102 through a plurality of solder interconnects 150c. The integrated device 107 is coupled to the substrate 102 through a plurality of solder interconnects 170. The substrate 102 includes at least one dielectric layer 120 and a plurality of interconnects 122. The package 700 is coupled to a board 106.

The coupling element 604a includes a first inductor 640a and a second inductor 642a. The first inductor 640a includes a first plurality of windings. The second inductor 642a includes a second plurality of windings. The first inductor 640a is intertwined (e.g., vertically intertwined and/or horizontally intertwined) with the second inductor 642a. For example, the first plurality of windings of the first inductor 640a is intertwined (e.g., vertically intertwined and/or horizontally intertwined) with the second plurality of windings of the second inductor 642a. The first plurality of windings of the first inductor 640a may be defined by a first plurality of interconnects from the plurality of interconnects 122. The second plurality of windings of the second inductor 642a may be defined by a second plurality of interconnects from the plurality of interconnects 122. In some implementations, a first plurality of interconnects from the plurality of interconnects 122 may be intertwined (e.g., vertically intertwined and/or horizontally intertwined) with a second plurality of interconnects from the plurality of interconnects 122.

The coupling element 604b and the coupling element 604c may be configured and/or arranged in a similar manner as the coupling element 604a. Thus, the coupling element 604b and/or the coupling element 604c may each include a first inductor (e.g., 640b, 640c and a second inductor (e.g., 642b, 642c). Each of the inductors may have a respective number of windings that are defined by interconnects from the plurality of interconnects 122. The physical features (e.g., windings) and functional features that are described for the coupling element 604a, the first inductor 640a and/or the second inductor 642a may be applicable to the coupling element 604b, the coupling element 604c, the first inductor 640b, the second inductor 642b, the first inductor 640c and/or the second inductor 642c.

The integrated device 105a is configured to be coupled to the first inductor 640a of the coupling element 604a. The integrated device 105b is configured to be coupled to the first inductor 640b of the coupling element 604b. The integrated device 105c is configured to be coupled to the first inductor 640c of the coupling element 604c. The integrated device 107 is configured to be coupled to the second inductor 642a of the coupling element 604a, the second inductor 642b of the coupling element 604b, and the second inductor 642c of the coupling element 604c. The package 700 may operate in a similar manner as described for the package 200 and/or the package 600. In some implementations, the second inductor 642a of the coupling element 604a, the second inductor 642b of the coupling element 604b and the second inductor 642c of the coupling element 604c are coupled together (e.g., coupled together in series). Thus, in some implementations, turning on the second inductor for any of the coupling elements may turn on the second inductor for all of the coupling elements (e.g., 604a, 604b, 604c).

The integrated device (e.g., 107) may be configured to control and/or tune in real-time the inductances of inductors coupled to several integrated devices (e.g., 105a. 105b, 105c) at the same time and/or sequentially. Thus, for example, the integrated device 107 may simultaneously control the inductance for each of the integrated devices (e.g., 105a, 105b, 105c) while each of these integrated devices (e.g., 105a, 105b, 105c) are in operation (e.g., while various signals are being processed, received and/or transmitted by each of these integrated devices (e.g., 105a, 105b, 105c)).

FIG. 8 illustrates an example of package 800 that includes a substrate with several coupling elements with at least one inductor having several windings. FIG. 8 may illustrate a package 800 that has a similar configuration to the package 300. The package 800 includes the substrate 102, the integrated device 105a, the integrated device 105b, the integrated device 105c, a coupling element 604a, a coupling element 604b, a coupling element 604c, an integrated device 107a, an integrated device 107b and an integrated device 107c. The integrated device 105a is coupled to the substrate 102 through a plurality of solder interconnects 150a. The integrated device 105b is coupled to the substrate 102 through a plurality of solder interconnects 150b. The integrated device 105c is coupled to the substrate 102 through a plurality of solder interconnects 150c. The integrated device 107a is coupled to the substrate 102 through a plurality of solder interconnects 170a. The integrated device 107b is coupled to the substrate 102 through a plurality of solder interconnects 170b. The integrated device 107c is coupled to the substrate 102 through a plurality of solder interconnects 170c. The substrate 102 includes at least one dielectric layer 120 and a plurality of interconnects 122.

The coupling element 604a includes a first inductor 640a and a second inductor 642a. The first inductor 640a includes a first plurality of windings. The second inductor 642a includes a second plurality of windings. The first inductor 640a is intertwined (e.g., vertically intertwined and/or horizontally intertwined) with the second inductor 642a. For example, the first plurality of windings of the first inductor 640a is intertwined (e.g., vertically intertwined and/or horizontally intertwined) with the second plurality of windings of the second inductor 642a. The first plurality of windings of the first inductor 640a may be defined by a first plurality of interconnects from the plurality of interconnects 122. The second plurality of windings of the second inductor 642a may be defined by a second plurality of interconnects from the plurality of interconnects 122. In some implementations, a first plurality of interconnects from the plurality of interconnects 122 may be intertwined (e.g., vertically intertwined and/or horizontally intertwined) with a second plurality of interconnects from the plurality of interconnects 122. The intertwining (e.g., vertical intertwining) of the inductors may provide improved inductive coupling between inductors and may improve real-time tuning of inductors (e.g., improved control of tuning of inductors).

The coupling element 604b and the coupling element 604c may be configured and/or arranged in a similar manner as the coupling element 604a. Thus, the coupling element 604b and/or the coupling element 604c may each include a first inductor (e.g., 640b, 640c) and a second inductor (e.g., 642b, 642c). Each of the inductors may have a respective number of windings that are defined by interconnects from the plurality of interconnects 122. The physical features (e.g., windings) and functional features that are described for the coupling element 604a, the first inductor 640a and/or the second inductor 642a may be applicable to the coupling element 604b, the coupling element 604c, the first inductor 640b, the second inductor 642b, the first inductor 640c and/or the second inductor 642c.

The integrated device 105a is configured to be coupled to the first inductor 640 of the coupling element 604a. The integrated device 105b is configured to be coupled to the first inductor 640b of the coupling element 604b. The integrated device 105c is configured to be coupled to the first inductor 640c of the coupling element 604c. The integrated device 107a is configured to be coupled to the second inductor 642a of the coupling element 604a. The integrated device 107b is configured to be coupled to the second inductor 642b of the coupling element 604b. The integrated device 107c is configured to be coupled to the second inductor 642c of the coupling element 604c. The package 800 may operate in a similar manner as described for the package 300 and/or the package 700.

The integrated device(s) (e.g., 107, 107a, 107b, 107c) of the package 600, the package 700, and/or the package 800 may be configured to be provide real-timing tuning of inductors for integrated devices, in a similar and/or identical manner as described in FIGS. 1-5. It is noted that for the package 600, the package 700 and the package 800, any of the coupling elements and/or integrated devices (e.g., 107, 107a, 107b, 107) may be horizontally offset (e.g., no vertical overlap or partial vertical overlap) to a corresponding integrated device (e.g., 105, 105a. 105b, 105c) in a similar manner as described for the package 400 and/or the package 500.

A coupling element (e.g., 104, 104a, 104b, 104c, 604, 604a, 604b, 604c) may be an inductive coupling element. A coupling element may be a means for inductive coupling. The disclosure describes a coupling element as comprising a first inductor and a second inductor. In some implementations, the first inductor may be considered as a third inductor and the second inductor may be considered as a fourth inductor. This may be the case where a substrate includes a first coupling element and a second coupling element. In some implementations, the first inductor may be considered as a fifth inductor and the second inductor may be considered as a sixth inductor. This may be the case where a substrate includes a first coupling element, a second coupling element, and a third coupling element.

Referring back to FIGS. 7 and 8, in some implementations, the coupling element 604a may be a first coupling element, the coupling element 604b may be a second coupling element, and the coupling element 604c may be a third coupling element. In some implementations, the first inductor 640a of the coupling element 604a may be a first inductor that includes a first plurality of windings (e.g., defined by a first plurality of interconnects), the second inductor 642a of the coupling element 604a may be a second inductor that includes a second plurality of windings (e.g., defined by a second plurality of interconnects), the first inductor 640b of the coupling element 604b may be a third inductor that includes a third plurality of windings (e.g., defined by a third plurality of interconnects), the second inductor 642b of the coupling element 604b may be a fourth inductor that includes a fourth plurality of windings (e.g., defined by a fourth plurality of interconnects), the first inductor 640c of the coupling element 604c may be a fifth inductor that includes a fifth plurality of windings (e.g., defined by a fifth plurality of interconnects), and the second inductor 642c of the coupling element 604c may be a sixth inductor that includes a sixth plurality of windings (e.g., defined by a sixth plurality of interconnects).

An integrated device (e.g., 105, 107, 205a) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 105, 107, 205a) may include at least one electronic circuit (e.g., first electronic circuit, second electronic circuit, etc. . . . ). An integrated device may include transistors. An integrated device may be an example of an electrical component and/or electrical device. In some implementations, an integrated device may be a chiplet. A chiplet may provide better yield during fabrication, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Using several chiplets that performs several functions may reduce the overall cost of a package relative to using a single chip to perform all of the functions of a package.

FIGS. 3, 5 and 8 illustrate a one or one ratio between the number of integrated devices and the number of controller dies. That is, one controller die is used to control and/or tune a coupling element for an integrated device. However, in some implementations, a package may include a first controller die that controls and/or tunes one coupling element and a second controller die that controls and/or tunes two or more coupling elements. Thus, a package may include different numbers (N) of integrated devices and different numbers (M) of controller dies, where a controller die may control and/or tune different numbers of coupling elements for integrated device(s). Thus, the number(N) of integrated devices does not need to equal to the number (M) of controller dies in a package.

The package (e.g., 100, 200, 300, 400, 500, 600, 700, 800) may be implemented in a radio frequency (RF) package. The RF package may be a radio frequency front end (RFFE) package. A package (e.g., 100, 200, 300, 400, 500, 600, 700, 800) may be configured to provide Wireless Fidelity (WiFi) communication and/or cellular communication (e.g., 2G, 3G, 4G, 5G). The packages (e.g., 100, 200, 300, 400, 500, 600, 700, 800) may be configured to support Global System for Mobile (GSM) Communications, Universal Mobile Telecommunications System (UMTS), and/or Long-Term Evolution (LTE). The packages (e.g., 100, 200, 300, 400, 500, 600, 700, 800) may be configured to transmit and receive signals having different frequencies and/or communication protocols.

Having described various packages, a sequence for fabricating a package will now be described below.

Figure 9A:
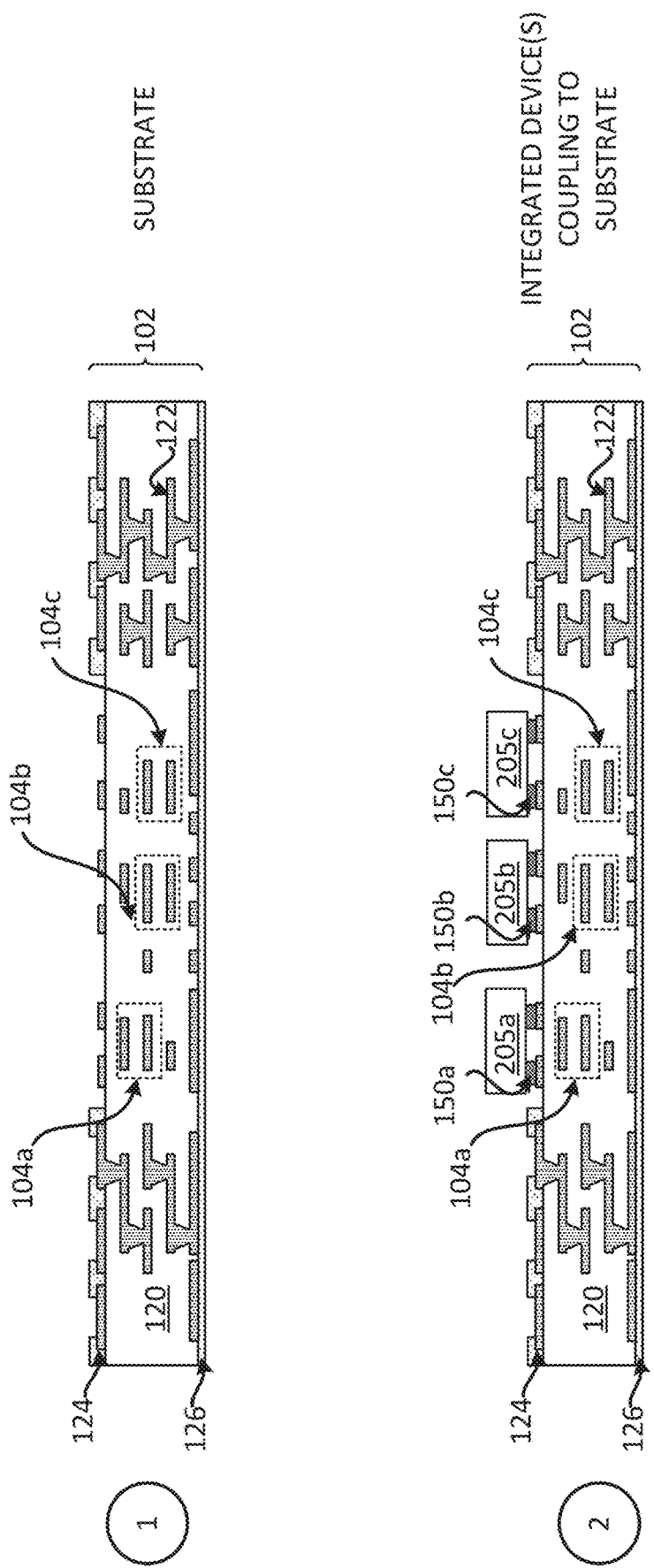
FIGS. 9A-9B illustrate an exemplary sequence for fabricating a package that includes a substrate comprising several coupling elements.
Figure 9B:
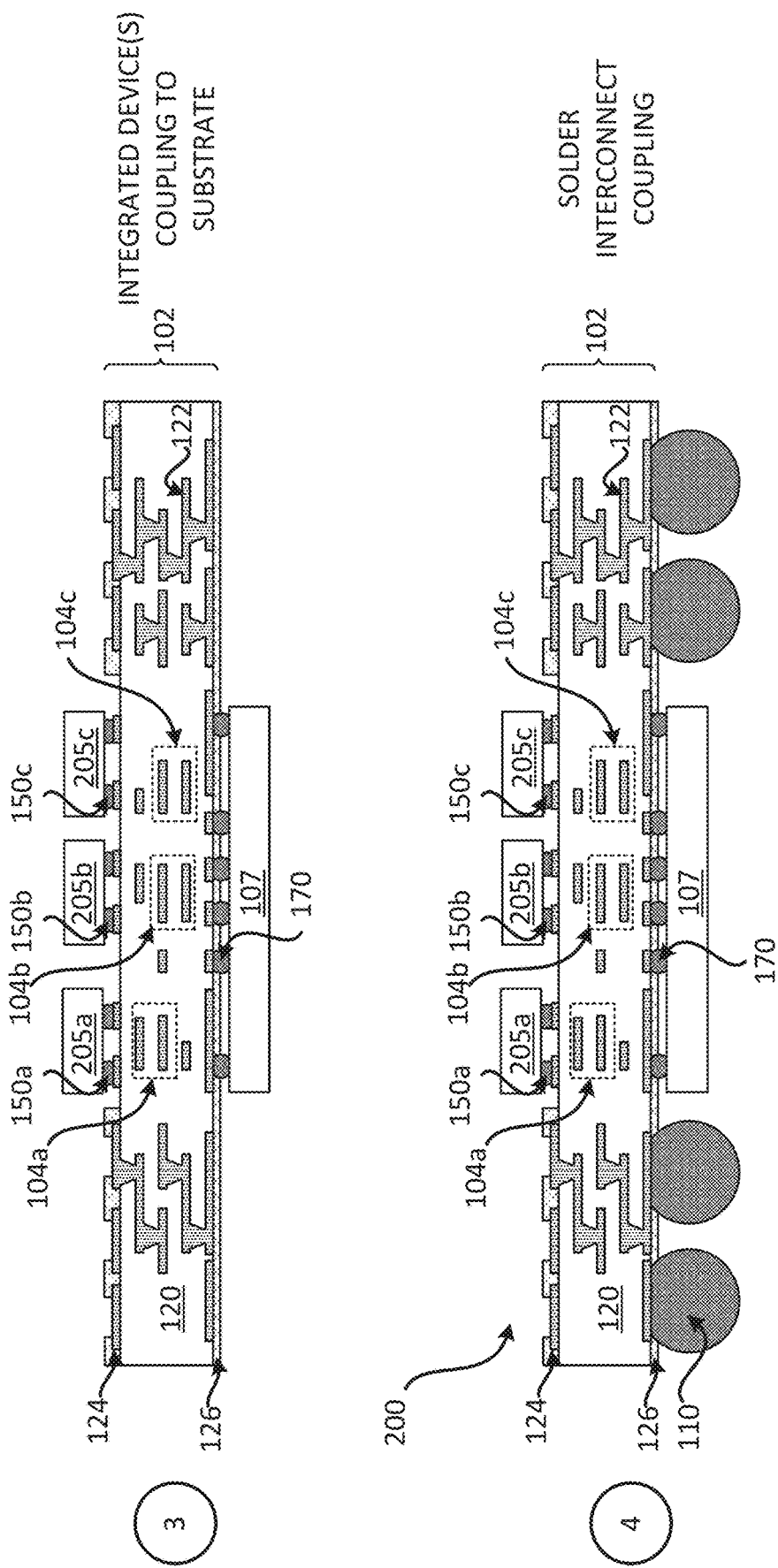

Exemplary Sequence for Fabricating a Package Comprising a Substrate with Coupling Element Comprising a First Inductor and a Second Inductor In some implementations, fabricating a package includes several processes. FIGS. 9A-9B illustrate an exemplary sequence for providing or fabricating a package. In some implementations, the sequence of FIGS. 9A-9B may be used to provide or fabricate the package 200. However, the process of FIGS. 9A-9B may be used to fabricate any of the packages (e.g., 100, 300, 400, 500, 600, 700, 800) described in the disclosure.

It should be noted that the sequence of FIGS. 9A-9B may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 9A, illustrates a state after a substrate 102 is provided. The substrate 102 includes at least one dielectric layer 120 and a plurality of interconnects 122. The substrate 102 may include a first surface (e.g., top surface) and a second surface (e.g., bottom surface). The substrate 102 may be fabricated using the method as described in FIGS. 11A-11B. In some implementations, a cored substrate is provided (e.g., substrate that includes a core layer). The substrate 102 includes a coupling element 104a, a coupling element 104b and a coupling element 104c. Each of the coupling element may include a first inductor and a second inductor. A first inductor of a coupling element may be defined by a first plurality of interconnects from the plurality of interconnects 122. A second inductor of a coupling element may be defined by a second plurality of interconnects from the plurality of interconnects 122.

Stage 2 illustrates a state after the integrated device 205a (e.g., first integrated device), the integrated device 205b and the integrated device 205c are coupled to the first surface (e.g., top surface) of the substrate 102. The integrated device 205a may be coupled to the substrate 102 through the plurality of solder interconnects 150a. The integrated device 205b may be coupled to the substrate 102 through the plurality of solder interconnects 150b. The integrated device 205c may be coupled to the substrate 102 through the plurality of solder interconnects 150c. A solder reflow process may be used to couple the integrated devices (e.g., 205a, 205b, 205c) to the substrate 102.

Stage 3, as shown in FIG. 9B, illustrates a state after the integrated device 107 is coupled to the second surface (e.g., bottom surface) of the substrate 102. The integrated device 107 (e.g., second integrated device) may be coupled to the substrate 102 through the plurality of solder interconnects 170. A solder reflow process may be used to couple the integrated device 107 to the substrate 102.

Stage 4 illustrates a state after a plurality of solder interconnects 110 is coupled to the second surface of the substrate 102. A solder reflow process may be used to couple the plurality of solder interconnects 110 to the substrate 102. Stage 4 may illustrate the package 200. The package 200 may be fabricated one at a time or may be fabricated together as part of one or more wafers and then singulated into individual packages.

Figure 10:
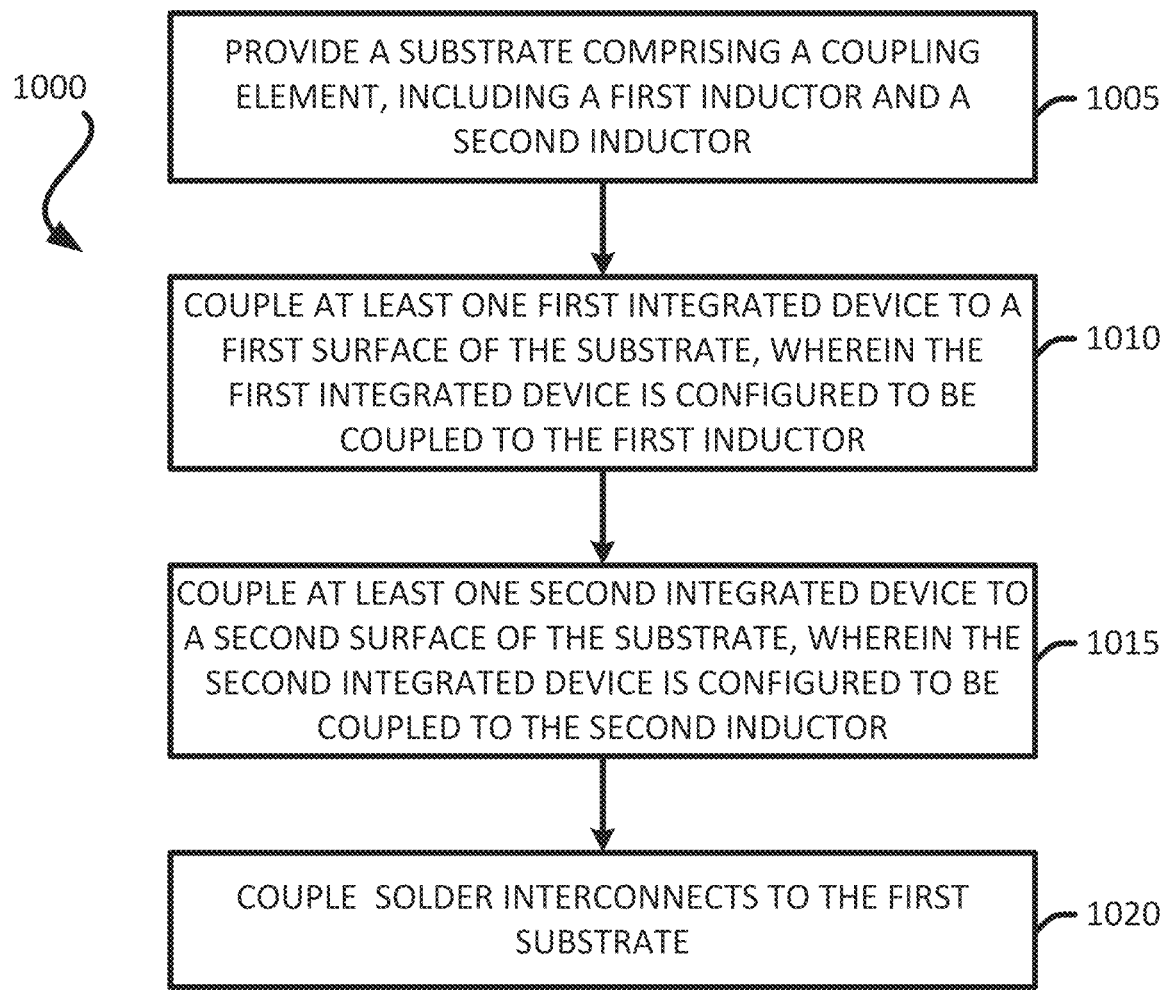
FIG. 10 illustrates an exemplary flow chart of a method for fabricating a package that includes a substrate comprising at least one coupling element.

Exemplary Flow Diagram of a Method for Fabricating a Package Comprising a Substrate with Coupling Element Comprising a First Inductor and a Second Inductor In some implementations, fabricating a package includes several processes. FIG. 10 illustrates an exemplary flow diagram of a method 1000 for providing or fabricating a package. In some implementations, the method 1000 of FIG. 10 may be used to provide or fabricate the package 200 described in the disclosure. However, the method 1000 may be used to provide or fabricate any of the packages (e.g., 100, 300, 400, 500, 600, 700, 800) described in the disclosure.

It should be noted that the method of FIG. 10 may combine one or more processes in order to simplify and/or clarify the method for providing or fabricating a package. In some implementations, the order of the processes may be changed or modified.

The method provides (at 1005) a substrate (e.g., 102). The substrate 102 includes at least one dielectric layer 120 and a plurality of interconnects 122. The substrate 102 may include a first surface (e.g., top surface) and a second surface (e.g., bottom surface). The substrate 102 may be fabricated using the method as described in FIGS. 11A-11B. In some implementations, a cored substrate is provided (e.g., substrate that includes a core layer). The substrate 102 includes a coupling element 104a, a coupling element 104b and a coupling element 104c. Each of the coupling element may include a first inductor and a second inductor. Stage 1 of FIG. 9A illustrates and describes an example of providing a substrate comprising coupling elements.

The method couples (at 1010) at least one first integrated device (e.g., 105, 205) to a first surface of the substrate (e.g., 102). The first integrated device may be coupled to the first surface (e.g., top surface) of the substrate 102. The first integrated device may be coupled to the substrate 102 through a plurality of solder interconnects (e.g., 150, 150a). A solder reflow process may be used to couple the first integrated devices (e.g., 205a, 205b, 205c) to the substrate 102. Stage 2 of FIG. 9A illustrates and describes an example of coupling integrated devices to a substrate.

The method couples (at 1015) at least one second integrated device (e.g., 107, 207a) to a second surface of the substrate (e.g., 102). The second integrated device may be coupled to the substrate 102 through the plurality of solder interconnects (e.g., 170). A solder reflow process may be used to couple the second integrated devices (e.g., 107, 207a) to the substrate 102. Stage 3 of FIG. 9B illustrates and describes an example of coupling an integrated device to a substrate.

The method couples (at 1020) a plurality of solder interconnects 110 to the second surface of the substrate 102. A solder reflow process may be used to couple the plurality of solder interconnects 110 to the substrate 102. Stage 4 of FIG. 9B illustrates and describes an example of coupling solder interconnects to a substrate.

Exemplary Sequence for Fabricating a Substrate

Figure 11A:
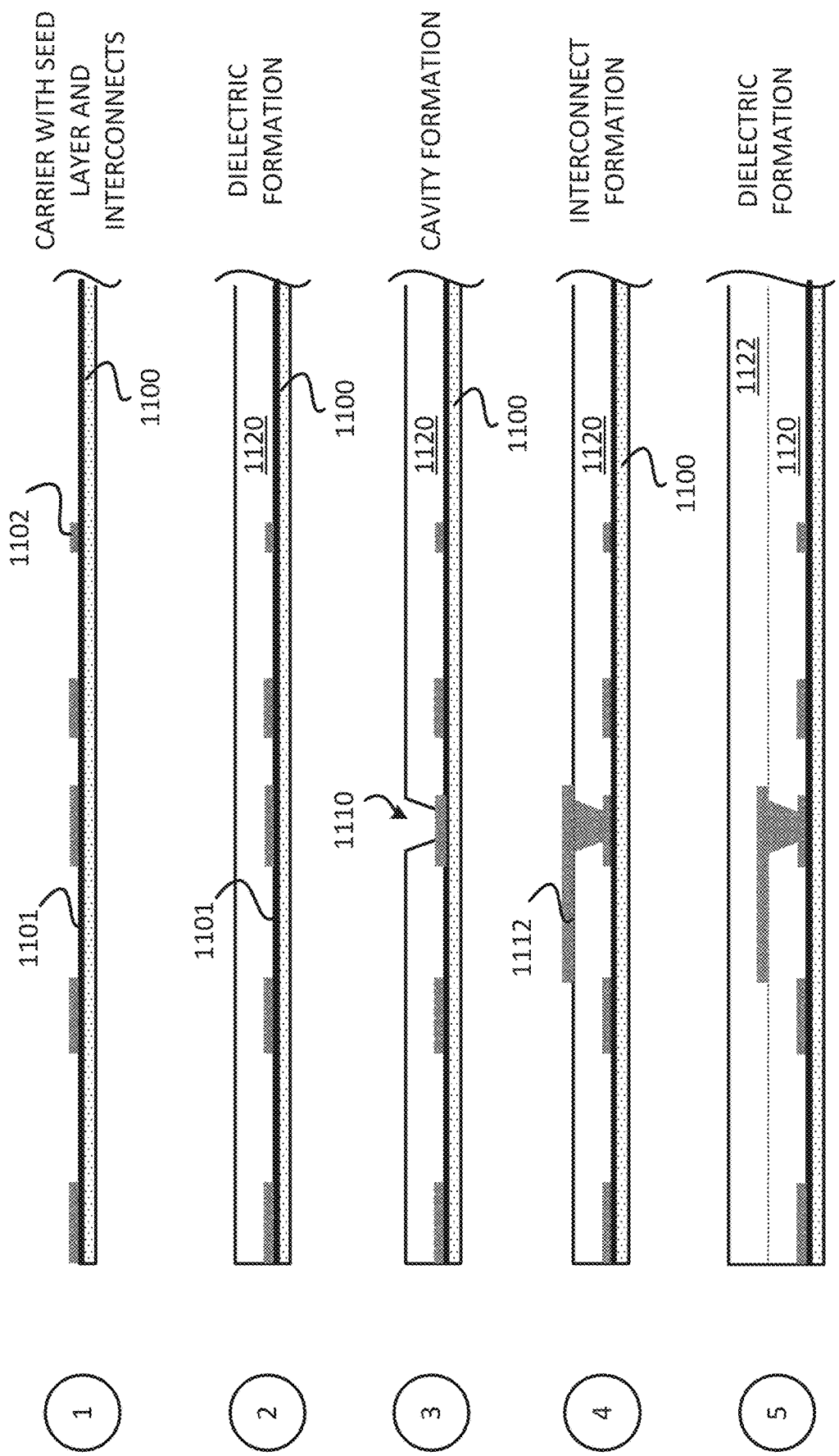
FIGS. 11A-11B illustrate an exemplary sequence for fabricating a substrate that includes at least one coupling element.
Figure 11B:
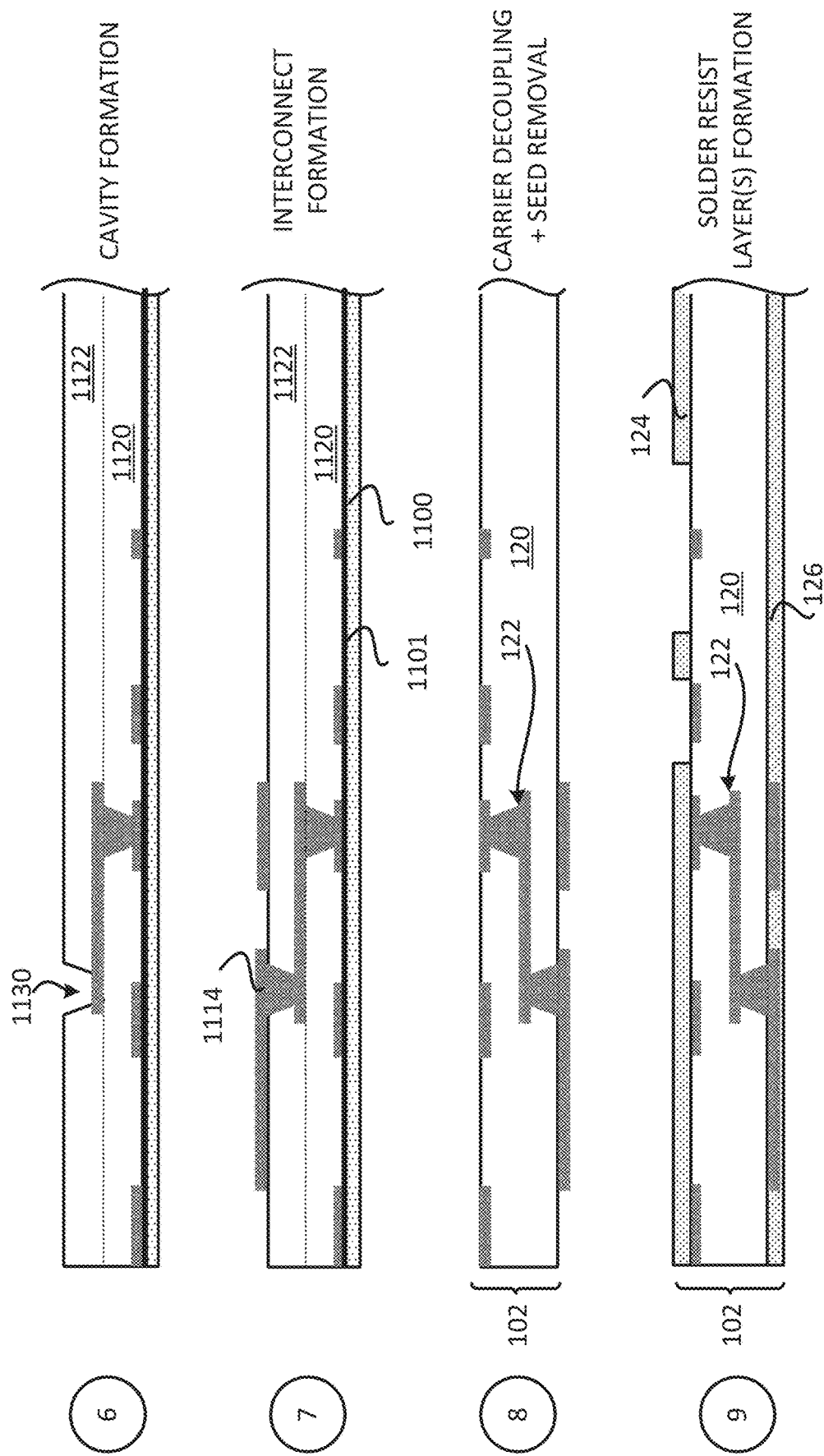

In some implementations, fabricating a substrate includes several processes. FIGS. 11A-11B illustrate an exemplary sequence for providing or fabricating a substrate. In some implementations, the sequence of FIGS. 11A-11B may be used to provide or fabricate the substrate 102. However, the process of FIGS. 11A-11B may be used to fabricate any of the substrates described in the disclosure.

It should be noted that the sequence of FIGS. 11A-11B may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 11A, illustrates a state after a carrier 1100 is provided. A seed layer 1101 and interconnects 1102 may be located over the carrier 1100. The interconnects 1102 may be located over the seed layer 1101. A plating process and etching process may be used to form the interconnects 1102. In some implementations, the carrier 1100 may be provided with the seed layer 1101 and a metal layer that is patterned to form the interconnects 1102. The interconnects 1102 may represent at least some of the interconnects from the plurality of interconnects 122.

Stage 2 illustrates a state after a dielectric layer 1120 is formed over the carrier 1100, the seed layer 1101 and the interconnects 1102. A deposition and/or lamination process may be used to form the dielectric layer 1120. The dielectric layer 1120 may include prepreg and/or polyimide. The dielectric layer 1120 may include a photo-imageable dielectric. However, different implementations may use different materials for the dielectric layer.

Stage 3 illustrates a state after a plurality of cavities 1110 is formed in the dielectric layer 1120. The plurality of cavities 1110 may be formed using an etching process (e.g., photo etching process) or laser process.

Stage 4 illustrates a state after interconnects 1112 are formed in and over the dielectric layer 1120, including in and over the plurality of cavities 1110. For example, a via, pad and/or traces may be formed. A plating process may be used to form the interconnects.

Stage 5 illustrates a state after a dielectric layer 1122 is formed over the dielectric layer 1120 and the interconnects 1112. A deposition and/or lamination process may be used to form the dielectric layer 1122. The dielectric layer 1122 may include prepreg and/or polyimide. The dielectric layer 1122 may include a photo-imageable dielectric. However, different implementations may use different materials for the dielectric layer.

Stage 6, as shown in FIG. 11B, illustrates a state after a plurality of cavities 1130 is formed in the dielectric layer 1122. The plurality of cavities 1130 may be formed using an etching process (e.g., photo etching process) or laser process.

Stage 7 illustrates a state after interconnects 1114 are formed in and over the dielectric layer 1122, including in and over the plurality of cavities 1130. For example, a via, pad and/or traces may be formed. A plating process may be used to form the interconnects.

Stage 8 illustrates a state after the carrier 1100 is decoupled (e.g., detached, removed, grinded out) from at least one dielectric layer 120 and the seed layer 1101, portions of the seed layer 1101 are removed (e.g., etched out), leaving the substrate 102 that includes at least one dielectric layer 120 and the plurality of interconnects 122. The plurality of interconnects 122 may represent the interconnects 1102, the interconnects 1112 and/or the interconnects 1114. The at least one dielectric layer 120 may represent the dielectric layer 1120 and/or the dielectric layer 1122. Some of the interconnects from the plurality of interconnects 122 may define inductors (e.g., 140, 142, 640, 642) and/or coupling elements (e.g., 104, 104a, 604a) as described in the disclosure.

Stage 9 illustrates a state after the solder resist layer 124 is formed over the first surface of the substrate 102, and after the solder resist layer 126 is formed over the second surface of the substrate 102. A deposition process and/or lamination process may be used to form the solder resist layer 124 and/or the solder resist layer 126.

Different implementations may use different processes for forming the metal layer(s) and/or interconnects. In some implementations, a chemical vapor deposition (CVD) process, a physical vapor deposition (PVD) process, a sputtering process, a spray coating process, and/or a plating process may be used to form the metal layer(s).

Exemplary Flow Diagram of a Method for Fabricating a Substrate

Figure 12:
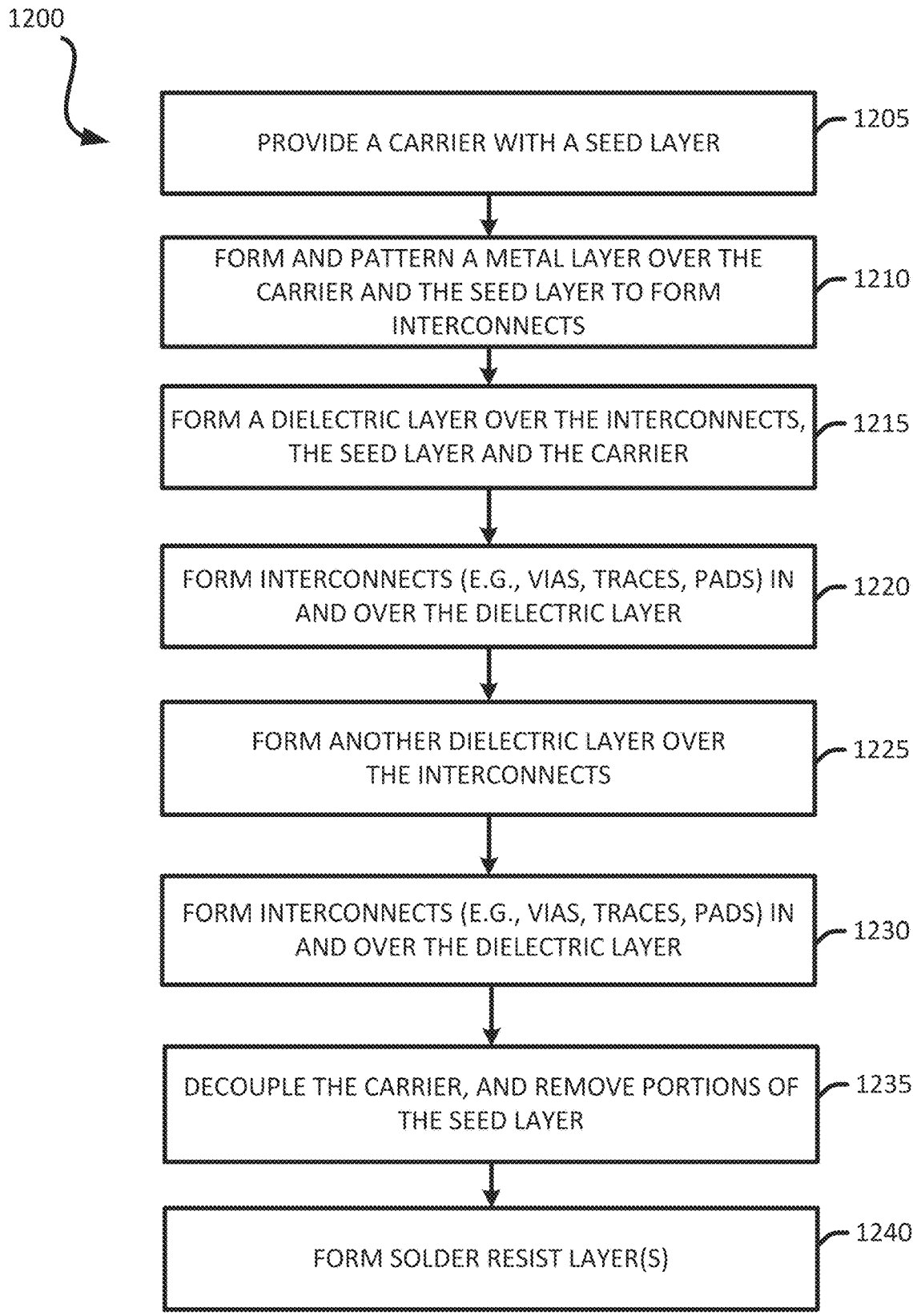
FIG. 12 illustrates an exemplary flow chart of a method for fabricating a substrate that includes at least one coupling element.

In some implementations, fabricating a substrate includes several processes. FIG. 12 illustrates an exemplary flow diagram of a method 1200 for providing or fabricating a substrate. In some implementations, the method 1200 of FIG. 12 may be used to provide or fabricate the substrate(s) of the disclosure. For example, the method 1200 of FIG. 12 may be used to fabricate the substrate 102.

It should be noted that the method 1200 of FIG. 12 may combine one or more processes in order to simplify and/or clarify the method for providing or fabricating a substrate. In some implementations, the order of the processes may be changed or modified.

The method provides (at 1205) a carrier (e.g., 1100). Different implementations may use different materials for the carrier 1100. The carrier 1100 may include a seed layer (e.g., 1101). The seed layer 1101 may include a metal (e.g., copper). The carrier may include a substrate, glass, quartz and/or carrier tape. Stage 1 of FIG. 11A illustrates and describes an example of a carrier with a seed layer that is provided.

The method forms and patterns (at 1210) interconnects over the carrier 1100 and the seed layer 1101. A metal layer may be patterned to form interconnects. A plating process may be used to form the metal layer and interconnects. In some implementations, the carrier and seed layer may include a metal layer. The metal layer is located over the seed layer and the metal layer may be patterned to form interconnects (e.g., 1102). Stage 1 of FIG. 11A illustrates and describes an example of forming and patterning interconnects over a seed layer and a carrier.

The method forms (at 1215) a dielectric layer 1120 over the seed layer 1101, the carrier 1100 and the interconnects 1102. A deposition and/or lamination process may be used to form the dielectric layer 1120. The dielectric layer 1120 may include prepreg and/or polyimide. The dielectric layer 1120 may include a photo-imageable dielectric. Forming the dielectric layer 1120 may also include forming a plurality of cavities (e.g., 1110) in the dielectric layer 1120. The plurality of cavities may be formed using an etching process (e.g., photo etching) or laser process. Stages 2-3 of FIG. 11A illustrate and describe an example of forming a dielectric layer and cavities in the dielectric layer.

The method forms (at 1220) interconnects in and over the dielectric layer. For example, the interconnects 1112 may be formed in and over the dielectric layer 1120. A plating process may be used to form the interconnects. Forming interconnects may include providing a patterned metal layer over and/or in the dielectric layer. Forming interconnects may also include forming interconnects in cavities of the dielectric layer. Stage 4 of FIG. 11A illustrates and describes an example of forming interconnects in and over a dielectric layer.

The method forms (at 1225) a dielectric layer 1122 over the dielectric layer 1120 and the interconnects 1112. A deposition and/or lamination process may be used to form the dielectric layer 1122. The dielectric layer 1122 may include prepreg and/or polyimide. The dielectric layer 1122 may include a photo-imageable dielectric. Forming the dielectric layer 1122 may also include forming a plurality of cavities (e.g., 1130) in the dielectric layer 1122. The plurality of cavities may be formed using an etching process (e.g., photo etching) or laser process. Stages 5-6 of FIGS. 11A-11B illustrate and describe an example of forming a dielectric layer and cavities in the dielectric layer.

The method forms (at 1230) interconnects in and over the dielectric layer. For example, the interconnects 1114 may be formed in and over the dielectric layer 1122. A plating process may be used to form the interconnects. Forming interconnects may include providing a patterned metal layer over and/or in the dielectric layer. Forming interconnects may also include forming interconnects in cavities of the dielectric layer. Stage 7 of FIG. 11B illustrates and describes an example of forming interconnects in and over a dielectric layer.

The method decouples (at 1235) the carrier (e.g., 1100) from the seed layer (e.g., 1101). The carrier 1100 may be detached and/or grinded off. The method may also remove (at 1235) portions of the seed layer (e.g., 1101). An etching process may be used to remove portions of the seed layer 1101. Stage 8 of FIG. 11B illustrates and describes an example of decoupling a carrier and seed layer removal.

The method may form (at 1240) solder resist layer(s) over the first surface and/or the second surface of the substrate. For example, a first solder resist layer may be formed over a first surface of the substrate, and/or a second solder resist layer may be formed over a second surface of the substrate. Stage 9 of FIG. 11B illustrates and describes an example of providing and/or forming solder resist layers.

Forming the interconnects of the substrate includes forming a plurality of interconnects 122. Some of the interconnects from the plurality of interconnects 122 may define inductors (e.g., 140, 142, 640, 642) and/or coupling elements (e.g., 104, 104a. 604a) as described in the disclosure.

Different implementations may use different processes for forming the metal layer(s). In some implementations, a chemical vapor deposition (CVD) process, a physical vapor deposition (PVD) process, a sputtering process, a spray coating process, and/or a plating process may be used to form the metal layer(s).

Exemplary Electronic Devices

Figure 13:
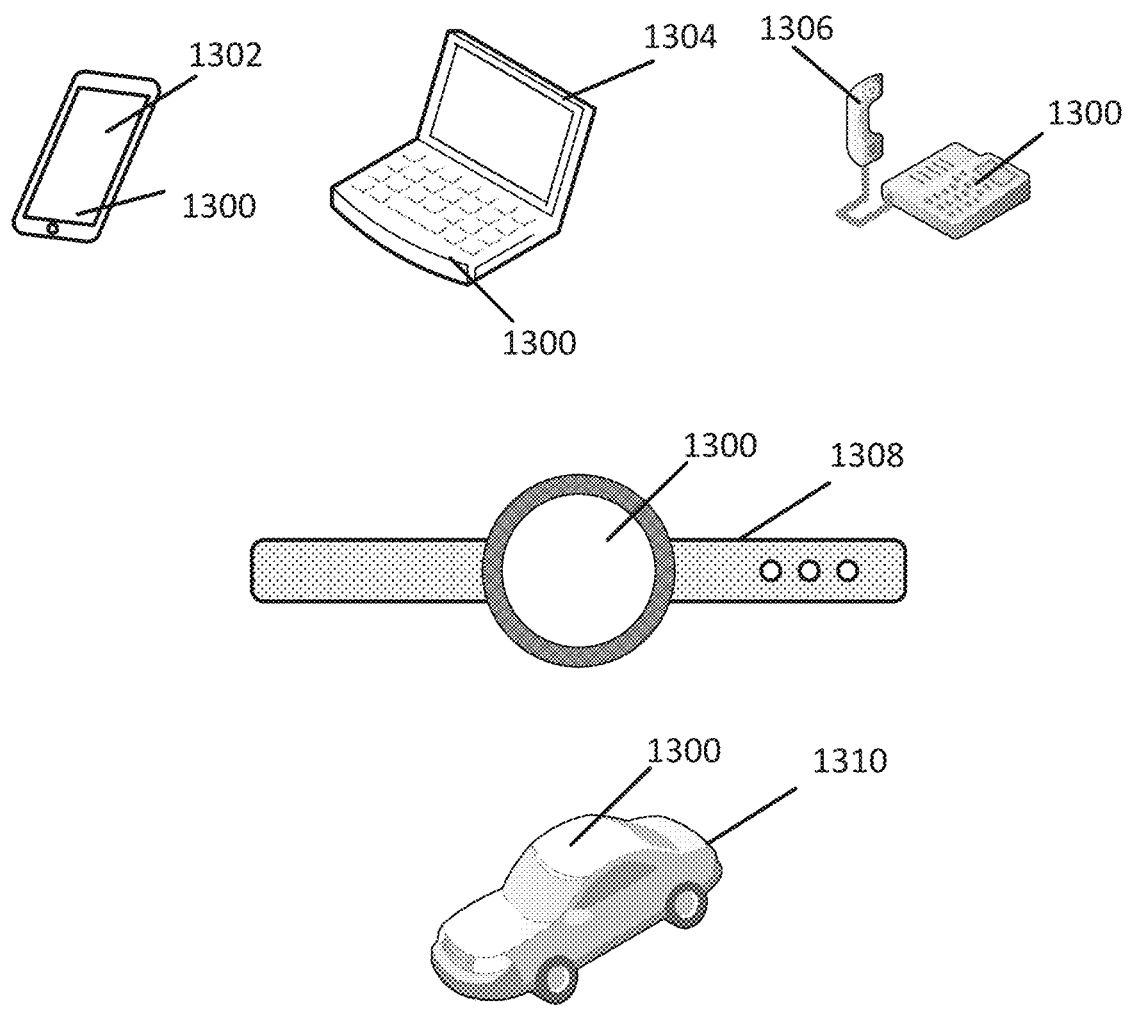
FIG. 13 illustrates various electronic devices that may integrate a die, an electronic circuit, an integrated device, an integrated passive device (IPD), a passive component, a package, and/or a device package described herein.

FIG. 13 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1302, a laptop computer device 1304, a fixed location terminal device 1306, a wearable device 1308, or automotive vehicle 1310 may include a device 1300 as described herein. The device 1300 may be, for example, any of the devices and/or integrated circuit (IC) packages described herein. The devices 1302, 1304, 1306 and 1308 and the vehicle 1310 illustrated in FIG. 13 are merely exemplary. Other electronic devices may also feature the device 1300 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-8, 9A-9B, 10, 11A-11B and 12-13 may be rearranged and/or combined into a single component, process, feature or function or embodied in several components, processes, or functions. Additional elements, components, processes, and/or functions may also be added without departing from the disclosure. It should also be noted FIGS. 1-8, 9A-9B, 10, 11A-11B and 12-13 and its corresponding description in the present disclosure is not limited to dies and/or ICs. In some implementations, FIGS. 1-8, 9A-9B, 10, 11A-11B and 12-13 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace (e.g., trace interconnect), a via (e.g., via interconnect), a pad (e.g., pad interconnect), a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising: a substrate comprising a dielectric layer and a plurality of interconnects, wherein the plurality of interconnects comprises: a first plurality of interconnects configured as a first inductor; and a second plurality of interconnects configured as a second inductor; a first integrated device coupled to a first surface of the substrate, wherein the first integrated device is configured to be coupled to the first inductor; and a second integrated device coupled to a second surface of the substrate, wherein the second integrated device is configured to be coupled to the second inductor, and wherein the second integrated device is configured to tune the first inductor through the second inductor.

Aspect 2: The package of aspect 1, wherein the first inductor and the second inductor are configured as a coupling element between the first integrated device and the second integrated device.

Aspect 3: The package of aspects 1 through 2, wherein at least one winding of the first inductor overlaps vertically with at least one winding of the second inductor.

Aspect 4: The package of aspects 1 through 3, wherein the first integrated device overlaps vertically with the second integrated device.

Aspect 5: The package of aspects 1 through 3, wherein the first integrate device does not overlap vertically with the second integrated device.

Aspect 6: The package of aspects 1 through 5, further comprising a third integrated device coupled to the first surface of the substrate, wherein the plurality of interconnects comprises a third plurality of interconnects configured as a third inductor, wherein the third integrated device is configured to be coupled to the third inductor, wherein the plurality of interconnects comprises a fourth plurality of interconnects configured as a fourth inductor, wherein the second integrated device is configured to be coupled to the fourth inductor, and wherein the second integrated device is configured to tune the third inductor through the fourth inductor.

Aspect 7: The package of aspect 6, wherein the second integrated device includes a controller die configured to tune the first inductor for the first integrated device and/or the third inductor for the third integrated device, based on sub-bands data and/or input bandwidth for the first integrated device and/or the third integrated device. In some implementations, the controller die is configured to tune the first inductor for the first integrated device and the third inductor for the third integrated device, at the same time.

Aspect 8: The package of aspects 1 through 5, further comprising: a third integrated device coupled to the first surface of the substrate; and a fourth integrated device coupled to the second surface of the substrate, wherein the plurality of interconnects comprises a third plurality of interconnects configured as a third inductor, wherein the third integrated device is configured to be coupled to the third inductor, wherein the plurality of interconnects comprises a fourth plurality of interconnects configured as a fourth inductor, wherein the fourth integrated device is configured to be coupled to the fourth inductor, and wherein the fourth integrated device is configured to tune the third inductor through the fourth inductor.

Aspect 9: The package of aspect 8, wherein the second integrated device includes a first controller die configured to tune the first inductor for the first integrated device, based on sub-bands data and/or input bandwidth for the first integrated device, and wherein the fourth integrated device includes a second controller die configured to tune the third inductor for the third integrated device, based on sub-bands data and/or input bandwidth for the third integrated device.

Aspect 10: The package of aspects 1 through 9, wherein the first inductor includes one or more windings, and wherein the second inductor includes one or more windings.

Aspect 11: A package comprising: a substrate comprising: means for first inductance; and means for second inductance; a first integrated device coupled to a first surface of the substrate, wherein the first integrated device is configured to be coupled to the means for first inductance; and a second integrated device coupled to a second surface of the substrate, wherein the second integrated device is configured to be coupled to the means for second inductance, and wherein the second integrated device is configured to tune the means for first inductance through the means for second inductance.

Aspect 12: The package of aspect 11, wherein the means for first inductance and the means for second inductance are configured as an inductive coupling element between the first integrated device and the second integrated device.

Aspect 13: The package of aspects 11 through 12, wherein at least one winding of the means for first inductance overlaps vertically with at least one winding of the means for second inductance.

Aspect 14: The package of aspects 11 through 13, wherein the first integrated device overlaps vertically with the second integrated device.

Aspect 15: The package of aspects 11 through 13, wherein the first integrate device does not overlap vertically with the second integrated device.

Aspect 16: The package of aspects 11 through 15, further comprising a third integrated device coupled to the first surface of the substrate, wherein the substrate comprises a means for third inductance and a means for fourth inductance, wherein the third integrated device is configured to be coupled to the means for third inductance, wherein the second integrated device is configured to be coupled to the means for fourth inductance, and wherein the second integrated device is configured to tune the means for third inductance through the means for fourth inductance.

Aspect 17: The package of aspect 16, wherein the second integrated device includes a controller die configured to tune the means for first inductance for the first integrated device and/or the means for third inductance for the third integrated device, based on sub-bands data and/or input bandwidth for the first integrated device and/or the third integrated device. In some implementations, the controller die is configured to tune the means for first inductance for the first integrated device and the means for third inductance for the third integrated device, at the same time.

Aspect 18: The package of aspects 11 through 15, further comprising: a third integrated device coupled to the first surface of the substrate; and a fourth integrated device coupled to the second surface of the substrate, wherein the substrate comprises a means for third inductance and a means for fourth inductance, wherein the third integrated device is configured to be coupled to the means for third inductance, wherein the fourth integrated device is configured to be coupled to the means for fourth inductance, and wherein the fourth integrated device is configured to tune the means for third inductance through the means for fourth inductance.

Aspect 19: The package of aspect 18, wherein the second integrated device includes a first controller die configured to tune the means for first inductance for the first integrated device, based on sub-bands data and/or input bandwidth for the first integrated device, and wherein the fourth integrated device includes a second controller die configured to tune the means for third inductance for the third integrated device, based on sub-bands data and/or input bandwidth for the third integrated device.

Aspect 20: The package of aspects 11 through 19, wherein the means for first inductance includes one or more windings, and wherein the means for second inductance includes one or more windings.

Aspect 21: The package of aspects 11 through 20, wherein the means for first inductance and the means for second inductance is part of a means for inductive coupling, wherein the means for inductive coupling is part of a plurality of means for inductive coupling, wherein the first integrated device is part of a first plurality of integrated devices, wherein the second integrated device is part of a second plurality of integrated devices, wherein the second plurality of integrated devices is configured to control and/or tune inductances coupled to the first plurality of integrated devices.

Aspect 22: The package of aspect 21, wherein a number of integrated devices in the first plurality of integrated devices is the same as a number of integrated devices in the second plurality of integrated vices.

Aspect 23: The package of aspect 21, wherein a number of integrated devices in the first plurality of integrated devices is the different than a number of integrated devices in the second plurality of integrated vices.

Aspect 24: The package of aspects 22 through 23, wherein each of the integrated devices from the second plurality of integrated devices includes a controller die.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a substrate comprising a dielectric layer and a plurality of interconnects, wherein the plurality of interconnects comprises:
a first plurality of interconnects configured as a first inductor; and
a second plurality of interconnects configured as a second inductor;
a first die coupled to a first surface of the substrate, wherein the first integrated device is configured to be coupled to the first inductor; and
a second die coupled to a second surface of the substrate, wherein the second die is configured to be coupled to the second inductor, and
wherein the second die is configured to tune the first inductor through the second inductor.

2. The package of claim 1, wherein the first inductor and the second inductor are configured as a coupling element between the first die and the second die.

3. The package of claim 1, wherein at least one winding of the first inductor overlaps vertically with at least one winding of the second inductor.

4. The package of claim 1, wherein the first die overlaps vertically with the second die.

5. The package of claim 1, wherein the first integrate device does not overlap vertically with the second die.

6. The package of claim 1, further comprising a third die coupled to the first surface of the substrate,
wherein the plurality of interconnects comprises a third plurality of interconnects configured as a third inductor,
wherein the third die is configured to be coupled to the third inductor,
wherein the plurality of interconnects comprises a fourth plurality of interconnects configured as a fourth inductor,
wherein the second die is configured to be coupled to the fourth inductor, and
wherein the second die is configured to tune the third inductor through the fourth inductor.

7. The package of claim 6, wherein the second die includes a controller die configured to tune the first inductor for the first die and/or the third inductor for the third die, based on sub-bands data and/or input bandwidth for the first die and/or the third die.

8. The package of claim 1, further comprising:
a third die coupled to the first surface of the substrate; and
a fourth die coupled to the second surface of the substrate,
wherein the plurality of interconnects comprises a third plurality of interconnects configured as a third inductor,
wherein the third die is configured to be coupled to the third inductor,
wherein the plurality of interconnects comprises a fourth plurality of interconnects configured as a fourth inductor,
wherein the fourth die is configured to be coupled to the fourth inductor, and
wherein the fourth die is configured to tune the third inductor through the fourth inductor.

9. The package of claim 8,
wherein the second die includes a first controller die configured to tune the first inductor for the first die, based on sub-bands data and/or input bandwidth for the first die, and
wherein the fourth die includes a second controller die configured to tune the third inductor for the third die, based on sub-bands data and/or input bandwidth for the third die.

10. The package of claim 1,
wherein the first inductor includes one or more first windings, and
wherein the second inductor includes one or more second windings.

* * * * *